(12) United States Patent
Sato et al.

(10) Patent No.: US 12,057,367 B2
(45) Date of Patent: Aug. 6, 2024

(54) SEMICONDUCTOR DEVICE AND METHOD FOR MANUFACTURING THE SAME

(71) Applicant: FUJI ELECTRIC CO., LTD., Kawasaki (JP)

(72) Inventors: Yushi Sato, Matsumoto (JP); Yuichiro Hinata, Matsumoto (JP); Naoyuki Kanai, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 192 days.

(21) Appl. No.: 17/586,264

(22) Filed: Jan. 27, 2022

(65) Prior Publication Data
US 2022/0278018 A1 Sep. 1, 2022

(30) Foreign Application Priority Data
Mar. 1, 2021 (JP) .................................. 2021-031483

(51) Int. Cl.
| | |
|---|---|
| H01L 23/06 | (2006.01) |
| H01L 21/48 | (2006.01) |
| H01L 21/56 | (2006.01) |
| H01L 23/10 | (2006.01) |
| H01L 23/31 | (2006.01) |
| H01L 23/373 | (2006.01) |

(52) U.S. Cl.
CPC ...... *H01L 23/3735* (2013.01); *H01L 21/4807* (2013.01); *H01L 21/565* (2013.01); *H01L 23/3107* (2013.01)

(58) Field of Classification Search
CPC ... H01L 21/4807; H01L 21/565; H01L 23/16; H01L 23/49541; H01L 23/49548; H01L 2224/0603; H01L 23/4334
USPC ......................................................... 257/703
See application file for complete search history.

(56) References Cited

U.S. PATENT DOCUMENTS

| | | | |
|---|---|---|---|
| 6,396,138 B1 * | 5/2002 | Cheah ..................... | H01L 24/82 257/734 |
| 10,290,565 B2 * | 5/2019 | Kimura ............ | H01L 23/49575 |

FOREIGN PATENT DOCUMENTS

JP 2001-267469 A 9/2001

* cited by examiner

*Primary Examiner* — Kimberly N Rizkallah
*Assistant Examiner* — Dilinh P Nguyen
(74) *Attorney, Agent, or Firm* — Rabin & Berdo, P.C.

(57) ABSTRACT

A semiconductor device includes a semiconductor chip, an insulated circuit board including a metal plate, an insulating plate and a circuit pattern, each of which has a rectangular shape, and a spacer part disposed on the periphery of a rear surface of the metal plate including at least one of the four corners thereof. The spacer part protrudes from a rear surface of the metal plate in the thickness direction away from a front surface of the insulated circuit board.

17 Claims, 26 Drawing Sheets

SEMICONDUCTOR DEVICE AND METHOD FOR MANUFACTURING THE SAME

CROSS-REFERENCE TO RELATED APPLICATION

This application is based upon and claims the benefit of priority of the prior Japanese Patent Application No. 2021-031483, filed on Mar. 1, 2021, the entire contents of which are incorporated herein by reference.

BACKGROUND OF THE INVENTION

1. Field of the Invention

The embodiments discussed herein relate to a semiconductor device and method for manufacturing the semiconductor device.

2. Background of the Related Art

Semiconductor devices include power devices and are used as power converters. Examples of such power devices are insulated gate bipolar transistors (IGBTs) and power metal oxide semiconductor field effect transistors (MOSFETs). In such a semiconductor device, semiconductor chips including power devices and an insulated circuit board are encapsulated with a sealing member.

In manufacturing the semiconductor device, first, the insulated circuit board with the semiconductor chips bonded thereto is laid out in a cavity provided within a predetermined mold. The sealing member is injected into the cavity to fill the cavity with the sealing member. The mold is removed to obtain the semiconductor device with the semiconductor chips and the insulated circuit board encapsulated with the sealing member.

Japanese Laid-open Patent Publications No. 2001-267469

The insulated circuit board with the semiconductor chips bonded thereto sometimes warps to be convex downward by heat produced during sealing operation with the sealing member. The warped insulated circuit board has gaps with the installation surface of the cavity. In particular, large gaps are formed at the four corners of the insulated circuit board. While filling the cavity, the sealing member also enters the gaps. After the completion of filling, the injected sealing member becomes cured and then the sealing member having entered the gaps forms burrs. Because burrs have poor thermal conductivity, the semiconductor device with burrs on the undersurface thereof has reduced heat dissipation. On the other hand, an additional step of removing the burrs raises manufacturing costs. In addition, if the burrs are not properly removed, the remaining burrs cause excessive stress exerted on the semiconductor device. Thus, the burrs reduce reliability of the semiconductor device.

SUMMARY OF THE INVENTION

According to an aspect, there is provided a semiconductor device, including a semiconductor chip; an insulated circuit board including: a metal plate having a rectangular shape, the metal plate having a front surface and a rear surface opposite to each other, the rear surface of the metal plate serving as a rear surface of the insulated circuit board, an insulating plate having a rectangular shape and being disposed on the front surface of the metal plate, and a circuit pattern having a front surface and a rear surface opposite to each other, and being disposed on the insulating plate, the semiconductor chip being disposed on the front surface of the circuit pattern, the front surface of the circuit pattern serving as a front surface of the insulated circuit board, the insulated circuit board being warped to be convex in a thickness direction of the insulated circuit board away from the front surface of the insulated circuit board; and a spacer part disposed on a periphery of the rear surface of the metal plate including at least one of four corners of the metal plate in a plan view of the semiconductor device, and protruding in the thickness direction away from the front surface of the insulated circuit board.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Several embodiments will be described below with reference to the accompanying drawings. Note that in the following the terms "front surface" and "top face" refer to surfaces facing upward (+Z direction) in a semiconductor device 10 of FIGS. 1 to 3. Similarly, the term "upper" refers to the upward direction (+Z direction) of the semiconductor device 10 of FIGS. 1 to 3. On the other hand, the terms "rear surface" and "undersurface" refer to surfaces facing downward (−Z direction) in the semiconductor device 10 of FIGS. 1 to 3. Similarly, the term "lower" refers to the downward direction (−Z direction) of the semiconductor device 10 of FIGS. 1 to 3. These terms have the same orientational relationship in other drawings if needed. The terms "front surface", "top face", "upper", "rear surface", "undersurface", "lower", and "lateral face" are simply expedient expressions used to specify relative positional relationships, and are not intended to limit the technical ideas of the embodiments described herein. For example, the terms "upper" and "lower" do not necessarily imply the vertical direction to the ground surface. That is, the "upper" and "lower" directions are not defined in relation to the direction of the gravitational force. In addition, the term "major component" in the following refers to a constituent having a concentration equal to 80 vol % or higher.

(a) First Embodiment

Figure 1:
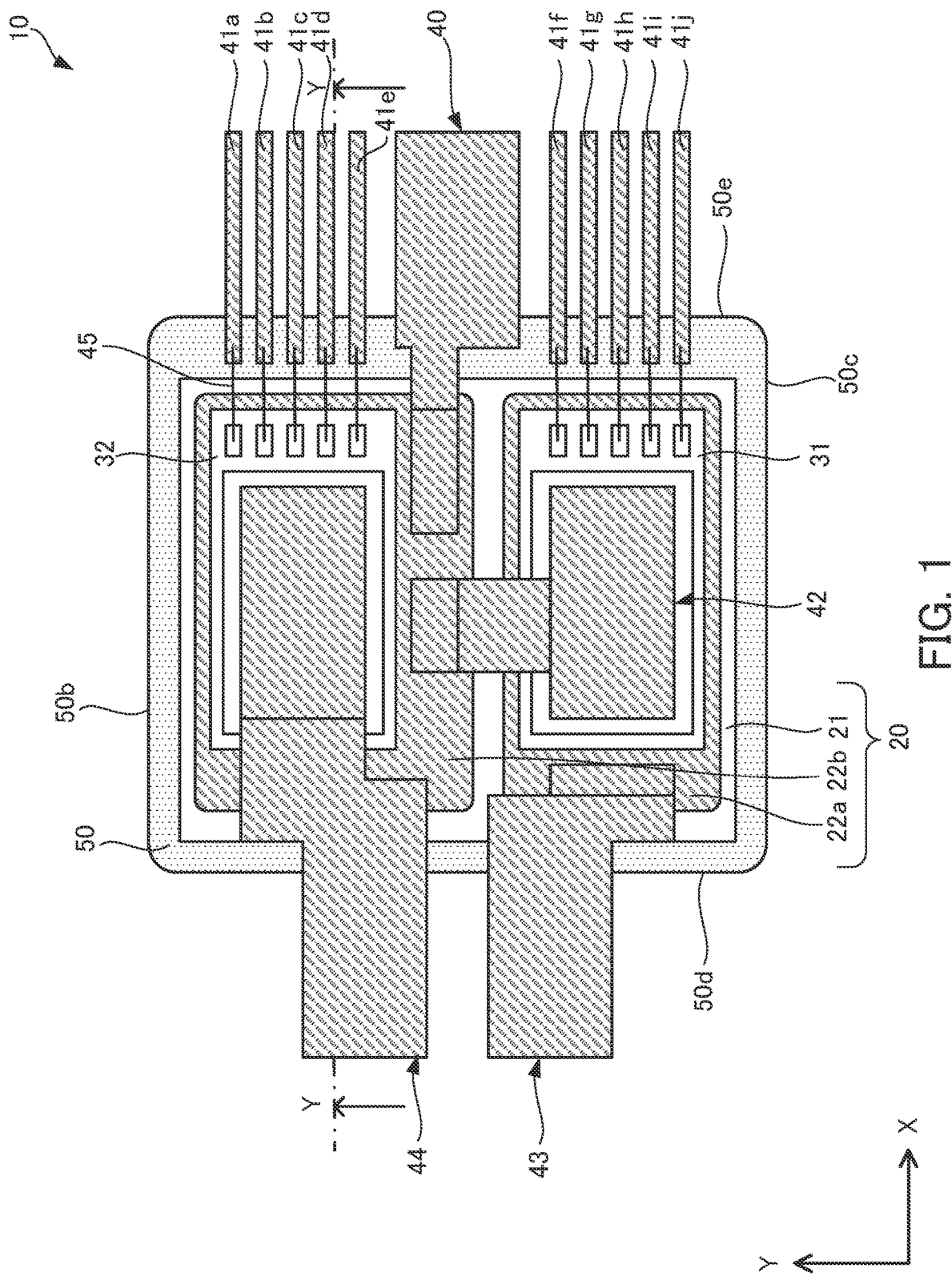
FIG. 1 is a plan view of a semiconductor device of a first embodiment.
Figure 2:
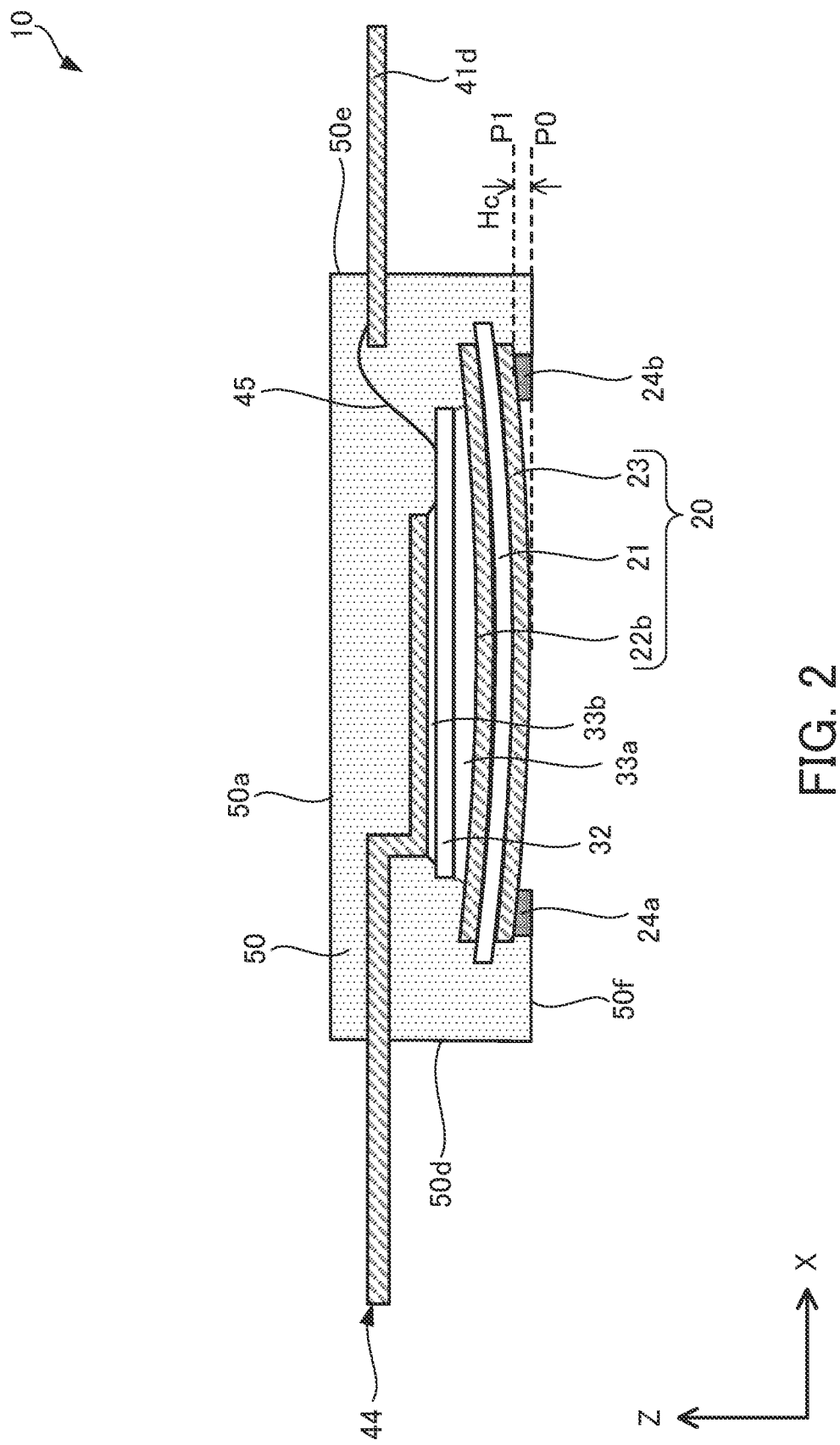
FIG. 2 is a sectional side view of the semiconductor device of the first embodiment.
Figure 3:
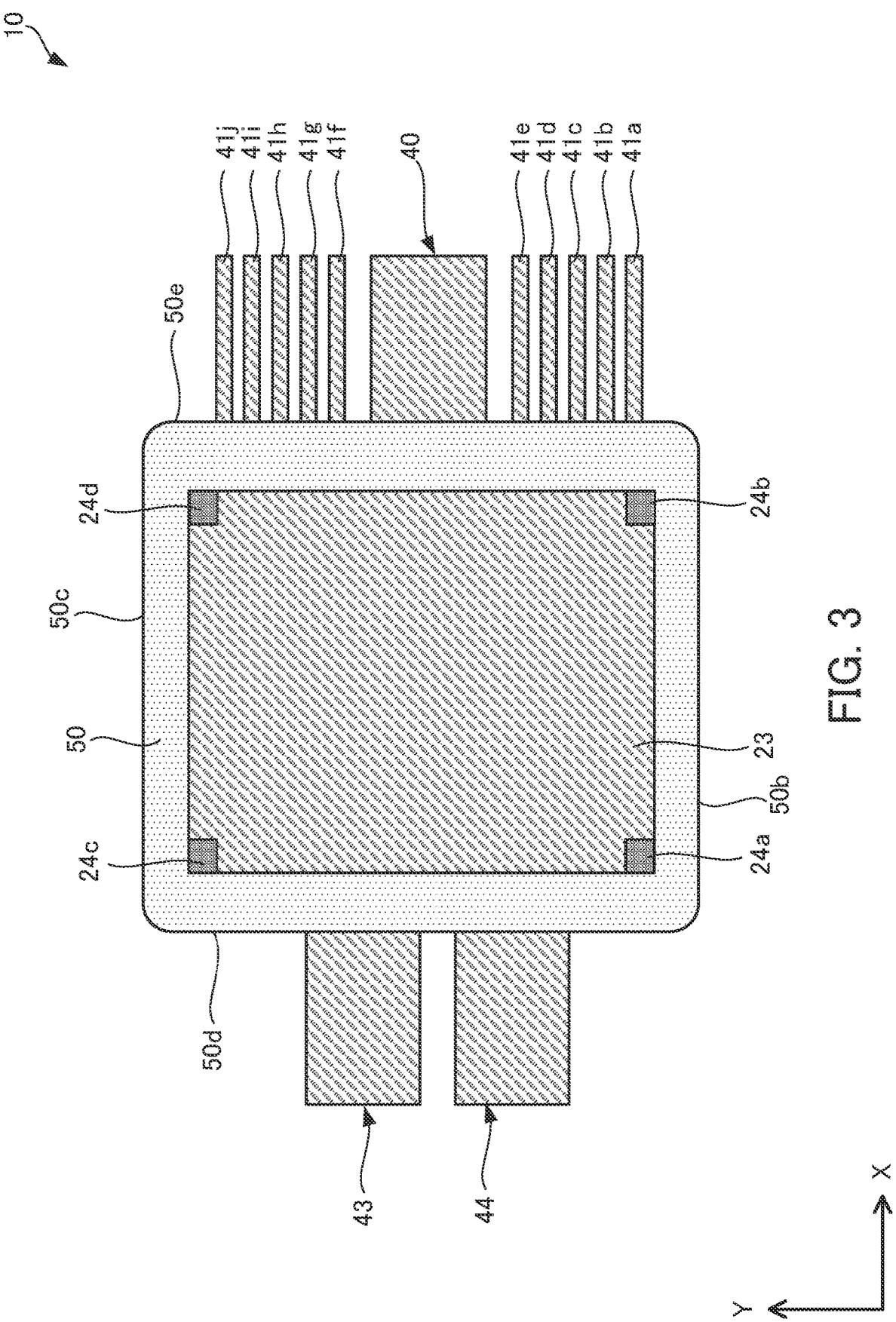
FIG. 3 is a rear view of the semiconductor device of the first embodiment.

Next described is a semiconductor device according to a first embodiment, with reference to FIGS. 1 to 3. FIG. 1 is a plan view of the semiconductor device of the first embodiment. FIG. 2 is a sectional side view of the semiconductor device of the first embodiment. FIG. 3 is a rear view of the semiconductor device of the first embodiment. Note that the plan view of FIG. 1 is illustrated in a transparent form. FIG. 2 is a cross-sectional view of the semiconductor device along dashed-dotted line Y-Y of FIG. 1.

The semiconductor device 10 includes an insulated circuit board 20, semiconductor chips 31 and 32, lead frames 40, 41a to 41j, 43, and 44, bonding wires 45, and a sealing member 50. The semiconductor chips 31 and 32 are placed on the front surface (top face) of the insulated circuit board 20. The semiconductor chips 31 and 32 and the front surface and lateral parts of the insulated circuit board 20 are encapsulated with the sealing member 50. The insulated circuit board 20 warps to be convex downward, with its rear surface facing down. Note that the warpage of the insulated circuit board 20 is described later. At the four corners of the insulated circuit board 20, spacer parts (corner spacer parts) 24a to 24d are provided in such a manner as to individually project downward.

The insulated circuit board 20 has a rectangular shape in a plan view. The insulated circuit board 20 includes an insulating plate 21, circuit patterns 22a and 22b formed on the front surface (top face) of the insulating plate 21, and a metal plate 23 provided on the rear surface (undersurface) of the insulating plate 21. On the front surfaces (top faces) of the circuit patterns 22a and 22b, the semiconductor chips 31 and 32, respectively, are mechanically and electrically connected by solder 33a.

The insulating plate 21 has a rectangular shape in a plan view. In addition, the insulating plate 21 may have R- or C-chamfered corners. The insulating plate 21 is made of ceramics with high thermal conductivity, whose major component is, for example, aluminum oxide, aluminum nitride, or silicon nitride. The insulating plate 21 has a thickness in the range of 0.2 mm to 2.0 mm inclusive.

The circuit patterns 22a and 22b are formed all over the insulating plate 21, except for its rim. Preferably, in a plan view, edges of the individual circuit patterns 22a and 22b, close to the outer periphery of the insulating plate 21 coincide with those of the metal plate 23, close to the outer periphery of the insulating plate 21. In this manner, the insulated circuit board 20 maintains a stress balance between the insulating plate 21 and the metal plate 23 placed on the rear surface of the insulating plate 21. This reduces damage to the insulating plate 21, such as excessive warpage and crack formation.

The circuit patterns 22a and 22b have a thickness in the range of 0.1 mm to 2.0 mm inclusive. The circuit patterns 22a and 22b are made of a metal with excellent electrical conductivity. The metal is, for example, copper, aluminum, or an alloy containing at least one of these. In order to provide improved corrosion resistance, plating may be applied to coat the surfaces of the circuit patterns 22a and 22b. In this case, a material used for plating is, for example, nickel, a nickel-phosphorus alloy, or a nickel-boron alloy. The circuit patterns 22a and 22b on the insulating plate 21 are created by forming a metal plate on the front surface of the insulating plate 21 and performing etching or the like on the metal plate. Alternatively, the circuit patterns 22a and 22b preliminarily cut out of a metal plate are pressure bonded to the front surface of the insulating plate 21. Note that the circuit patterns 22a and 22b are merely examples, and appropriate changes may be made to the number of circuit patterns, their shape, size and so on, as needed basis.

The metal plate 23 has a rectangular shape in a plan view. In addition, the metal plate 23 may have R- or C-chamfered corners. The metal plate 23 is smaller in size than the insulating plate 21, and formed all over the insulating plate 21, except for its rim. The metal plate 23 is made of a metal with excellent thermal conductivity as a major component. The metal is, for example, copper, aluminum, or an alloy containing at least one of these. The metal plate 23 has a thickness in the range of 0.1 mm to 2.0 mm inclusive. In order to provide improved corrosion resistance, plating may be applied to coat the metal plate 23. In this case, a material used for plating is, for example, nickel, a nickel-phosphorus alloy, or a nickel-boron alloy.

As the foregoing insulated circuit board 20, a direct copper bonding (DCB) substrate or an active metal brazed (AMB) substrate may be used. In bonding the semiconductor chips 31 and 32 to the circuit patterns 22a and 22b of the insulated circuit board 20 by the solder 33a, heat treatment is applied. In the insulated circuit board 20, the insulating plate 21, the circuit patterns 22a and 22b, and the metal plate 23 have different thermal expansion coefficients. Under the influence of heat, the insulated circuit board 20 warps such that the metal plate 23 sags downwards (in the −Z direction) in the center (see, for example, the insulated circuit board 20 of FIG. 5).

On the rear surface of the metal plate 23 included in the foregoing insulated circuit board 20, the spacer parts 24a to 24d are provided at the four corners of the metal plate 23 in such a manner as to individually project downward (in the −Z direction). In this connection, the spacer parts 24a to 24d do not need to be provided at all the four corners on the rear surface of the metal plate 24, and only a spacer part needs to be provided at at least one of the four corners. Each of the spacer parts 24a to 24d has a rectangular shape in a plan view (in the X-Y plane) as well as in a cross-sectional view (in the X-Z or Y-Z plane). The spacer parts 24a to 24d each may have the shape of a quadrangular prism. The spacer parts 24a to 24d are positioned at the four corners of the metal plate 23 such that one corner of each of the spacer parts 24a to 24d coincides with its corresponding corner of the metal plate 23 and the two sides forming the one corner are aligned along the sides of the metal plate 23. Therefore, the shape of each of the spacer parts 24a to 24d is not necessarily rectangular in a plan view (in the X-Y plane), and the individual spacer parts 24a to 24d simply need to have two sides perpendicular to each other, which positionally correspond to a region including each corner of the metal plate 23. Specifically, the spacer parts 24a to 24d each have, for example, the shape of an L or a right triangle. Various modifications of the spacer parts 24a to 24d are described later.

Alternatively, on the rear surface of the metal plate 23 included in the insulated circuit board 20 described above, the spacer parts 24a to 24d are provided adjacent to the four corners in such a manner as to individually project downward (in the −Z direction). On the rear surface of the metal plate 23 of the insulated circuit board 20, the outer edges of each of the spacer parts 24a to 24d are located, at least in a top view, outside of regions corresponding to the bonded regions of the semiconductor chips 31 and 32. In this case, each of the spacer parts 24a to 24d simply needs to have two sides parallel to the two sides forming the corresponding corner of the metal plate 23. Specifically, the spacer parts 24a to 24d may each have, for example, the shape of a rectangle, an L, or a right triangle.

Each of the spacer parts 24a to 24d has a thickness in the range of the amount of warpage Hc of the insulated circuit board 20 to Hc+200 µm inclusive. The warpage amount Hc is, as illustrated in FIG. 2, the height between a point P0 where the center of the insulated circuit board 20 warping to be convex downward lies and a point P1 where the rim of the insulated circuit board 20 (the metal plate 23) lies. The warpage amount Hc is, in other words, the height between the point P0 where the lowest point in the downward direction (the −Z direction) on the rear surface of the metal plate 23 lies and the point P1 where the highest point in the upward direction (the +Z direction) lies when the X-Y plane in which the front surfaces of the semiconductor chips 31 and 32 lie is used as a reference plane. The warpage amount Hc depends, for example, on the material of the insulated circuit board 20. The warpage amount Hc is, for example, in the range of 50 µm to 200 µm inclusive. Note that FIG. 2 depicts the case in which the rear surfaces of the spacer parts 24a to 24d located at the four corners of the insulated circuit board 20 lie in approximately the same plane as the center of the rear surface of the insulated circuit board 20. In addition, the front surfaces of the spacer parts 24a to 24b (which are in contact with the metal plate 23) may slope to correspond to the warpage of the metal plate 23. This allows the rear surfaces of the spacer parts 24a to 24d provided at the four corners of the rear surface of the insulated circuit board 20 to be kept almost horizontally.

The spacer parts 24a to 24d are made of a material with excellent thermal conductivity. The material includes, for example, a metal or ceramics as a major component. Examples of such a metal are copper, aluminum, tin, and an alloy containing at least one of these. The metal is preferably of the same kind as the metal plate 23. Further, the spacer parts 24a to 24d may be integrally formed with the metal plate 23. Example of such ceramics are materials each including aluminum oxide, aluminum nitride, or silicon nitride as its major component. In order to provide improved corrosion resistance, plating may be applied to coat the surfaces of the spacer parts 24a to 24d. In this case, a material used for plating is, for example, nickel, a nickel-phosphorus alloy, or a nickel-boron alloy.

The semiconductor chips 31 and 32 include switching elements made of silicon or silicon carbide. The switching elements are, for example, IGBTs or power MOSFETs. When the semiconductor chips 31 and 32 are IGBTs, they individually include a collector electrode on their rear surfaces as a main electrode. The semiconductor chips 31 and 32 also include, on their front surfaces, a gate electrode as a control electrode and an emitter electrode as a main electrode. When the semiconductor chips 31 and 32 are power MOSFETs, they include a drain electrode on their rear surfaces as a main electrode. The semiconductor chips 31 and 32 also include, on their front surfaces, a gate electrode as a control electrode and a source electrode as a main electrode. The rear surfaces of the semiconductor chips 31 and 32 are mechanically and electrically bonded onto the circuit patterns 22a and 22b via the solder 33a. To the main electrodes on the front surfaces of the semiconductor chips 31 and 32, a lead frame 42 and the lead frame 44 are mechanically and electrically bonded via solder 33b. In addition, to the control electrodes on the front surfaces of the semiconductor chips 31 and 32, the bonding wires 45 are mechanically and electrically connected as appropriate.

Alternatively, the semiconductor chips 31 and 32 include diodes made of silicon or silicon carbide. The diodes are free wheeling diodes (FWDs) such as Schottky barrier diodes (SBDs) or P-intrinsic-N (PiN) diodes. In this case, the semiconductor chips 31 and 32 individually include an output electrode (cathode electrode) on their rear surfaces as a main electrode and an input electrode (anode electrode) on their front surfaces as a main electrode. The rear surfaces of the semiconductor chips 31 and 32 are mechanically and electrically bonded onto the circuit patterns 22a and 22b via the solder 33a. To the main electrodes on the front surfaces of the semiconductor chips 31 and 32, the lead frames 42 and 44 are mechanically and electrically bonded via the solder 33b.

In place of the semiconductor chips 31 and 32, reverse-conducting IGBTs (RC-IGBTs) which have integrated functions of both an IGBT and FWD may be used. The semiconductor chips 31 and 32 may individually include, on their front surfaces, an auxiliary emitter electrode as a control electrode. In addition, the semiconductor chips 31 and 32 may include, on their front surfaces, a temperature sensing electrode and a current sensing electrode as control electrodes. In this case, the bonding wire 45 is mechanically and electrically connected to each of the control electrodes as appropriate. Note that the first embodiment illustrates the case with two semiconductor chips 31 and 32, but this is merely an example and the number of semiconductor chips may be flexibly set according to specifications or the like of the semiconductor device 10.

As for the lead frames 40, 41a to 41j, and 42 to 44, each of their first ends is electrically connected to the corresponding one of the semiconductor chips 31 and 32 inside the sealing member 50 while their second ends extend individually. The second ends may be external connecting terminals connected to external devices. The semiconductor device 10 may be a device that serves as a single-phase inverter circuit. In this case, the second end of the lead frame 40 may be an output terminal of the semiconductor device 10. The second ends of the lead frames 41a to 41j may be control terminals of the semiconductor device 10. The second end of the lead frame 43 may be a positive input terminal (P terminal). The second end of the lead frame 44 may be a negative input terminal (N terminal). The lead frames 40, 41a to 41j, and 42 to 44 are made of a metal with excellent electrical conductivity. The metal is, for example, copper, aluminum, or an alloy containing at least one of these. In order to provide improved corrosion resistance, plating may be applied to coat the surfaces of the lead frames 40, 41a to 41j, and 42 to 44. In this case, a material used for plating is, for example, nickel, a nickel-phosphorus alloy, or a nickel-boron alloy.

The first end of the lead frame 40 is bonded, inside the sealing member 50, to the circuit pattern 22b via the solder 33b serving as a bonding member. The bonding member is not limited to the solder 33b and may be a sintered compact. Alternatively, the first end of the lead frame 40 is directly bonded, inside the sealing member 50, to the circuit pattern 22b by laser or ultrasonic welding, for example. The second end of the lead frame 40 extends externally (in the +X direction) from a sealing lateral face 50e of the sealing member 50. The second end of the lead frame 40 may be an external connecting terminal (output terminal) connected to an external device (not illustrated). The second end of the lead frame 40 is located at a higher level (in the +Z direction) than its first end. The lead frame 40 includes an intermediate portion connecting the first and second ends. The intermediate portion extends from the first end upward in the vertical direction (in the +Z direction) or obliquely upward and is connected to the second end. Further, the second end of the lead frame 40 is located at a higher level (in the +Z direction) than the front surfaces of the semiconductor chips 31 and 32.

The first ends of the lead frames 41a to 41d are electrically connected to the semiconductor chip 32 via the bonding wires 45 inside the sealing member 50. The second ends of the lead frames 41a to 41d extend externally (in the +X direction) from the sealing lateral face 50e of the sealing member 50. The second ends of the lead frames 41a to 41d may be external connecting terminals (control terminals) connected to external devices (not illustrated). The first ends of the lead frames 41f to 41j are electrically connected to the semiconductor chip 31 via the bonding wires 45 inside the sealing member 50. The second ends of the lead frames 41f to 41j extend externally (in the +X direction) from the sealing lateral face 50e of the sealing member 50. The first and second ends of the lead frames 41a to 41d and 41f to 41j may be located at the same level (in the Z direction). That is, the lead frames 41a to 41d and 41f to 41j may individually be a straight line when viewed in lateral projection. The second ends of the lead frames 41a to 41d and 41f to 41j may be located at a higher level (in the +Z direction) than the front surfaces of the semiconductor chips 31 and 32.

The lead frame 42 is encapsulated with the sealing member 50. The first end of the lead frame 42 is bonded to the main electrode of the semiconductor chip 31 via the solder 33b serving as a bonding member. The second end of the lead frame 42 is mechanically and electrically bonded to the circuit pattern 22b via the solder 33b serving as a bonding member. Note that the bonding members are not limited to the solder 33b and may be sintered compacts. Alternatively, the second end of the lead frame 42 is directly bonded to the circuit pattern 22b, for example, by laser or ultrasonic welding.

The first end of the lead frame 43 is electrically and mechanically bonded, inside the sealing member 50, to the circuit pattern 22a via the solder 33b serving as a bonding member. The bonding member is not limited to the solder 33b and may be a sintered compact. Alternatively, the first end of the lead frame 43 is directly bonded to the circuit pattern 22a, for example, by laser or ultrasonic welding inside the sealing member 50. The second end of the lead frame 43 extends externally (in the −X direction) from a sealing lateral face 50d of the sealing member 50. The second end of the lead frame 43 may be an external connecting terminal (P terminal) connected to an external device (not illustrated).

The first end of the lead frame 44 is mechanically and electrically bonded, inside the sealing member 50, to the main electrode of the semiconductor chip 32 via the solder 33b serving as a bonding member. The bonding member is not limited to the solder 33b and may be a sintered compact. The second end of the lead frame 44 extends externally (in the −X direction) from the sealing lateral face 50d of the sealing member 50. The second end of the lead frame 44 may be an external connecting terminal (N terminal) connected to an external device (not illustrated).

The second ends of the lead frames 43 and 44 are individually located at higher levels (in the +Z direction) than the first ends thereof. Each of the lead frames 43 and 44 includes an intermediate portion connecting the first end and second end. The intermediate portion extends from the first end upward in the vertical direction (in the +Z direction) or obliquely upward and is connected to the second end. Further, the second ends of the lead frames 43 and 44 are located at higher levels (in the +Z direction) than the front surfaces of the semiconductor chips 31 and 32. Note that the lead frames 40, 41a to 41j, 42, 43, and 44 are merely examples, and appropriate changes may be made to their shapes, size, extension directions and so on, as needed basis.

The bonding wires 45 are made of a metal with excellent electrical conductivity as a major component. The metal is, for example, aluminum, copper, or an alloy containing at least one of these. Note that the bonding wires 45 are made of copper or a copper alloy. The bonding wires 45 preferably have a diameter in the range of 25 μm to 1 mm inclusive.

The sealing member 50 has the shape of a rectangular parallelepiped. The sealing member 50 has a sealing top face 50a, sealing lateral faces 50b to 50e, and a sealing bottom face 50f. Connections between the sealing lateral faces 50b to 50e may be R-shaped. The sealing member seals together the insulated circuit board 20, the semiconductor chips 31 and 32, and the lead frames 40, 41a to 41j, and 42 to 44. Note that the sealing member 50 seals part of the lead frames 40, 41a to 41j, 43, and 44. The sealing member 50 seals lateral parts of the spacer parts 24a to 24d, facing outside (spacer lateral parts), as well as the entire lateral periphery of the insulated circuit board 20. In the case of the first embodiment, the sealing bottom face 50f lies in the same plane as the bottom faces of the spacer parts 24a to 24d and the central part of the rear surface of the insulated circuit board 20.

The foregoing sealing member 50 includes a thermosetting resin and a filler material contained in the thermosetting resin. The thermosetting resin is, for example, epoxy resin, phenolic resin, or maleimide resin. Epoxy resin containing a filler material is an example of such a sealing member. The filler material used is an inorganic material, such as silicon oxide, aluminum oxide, boron nitride, or aluminum nitride.

Figure 4:
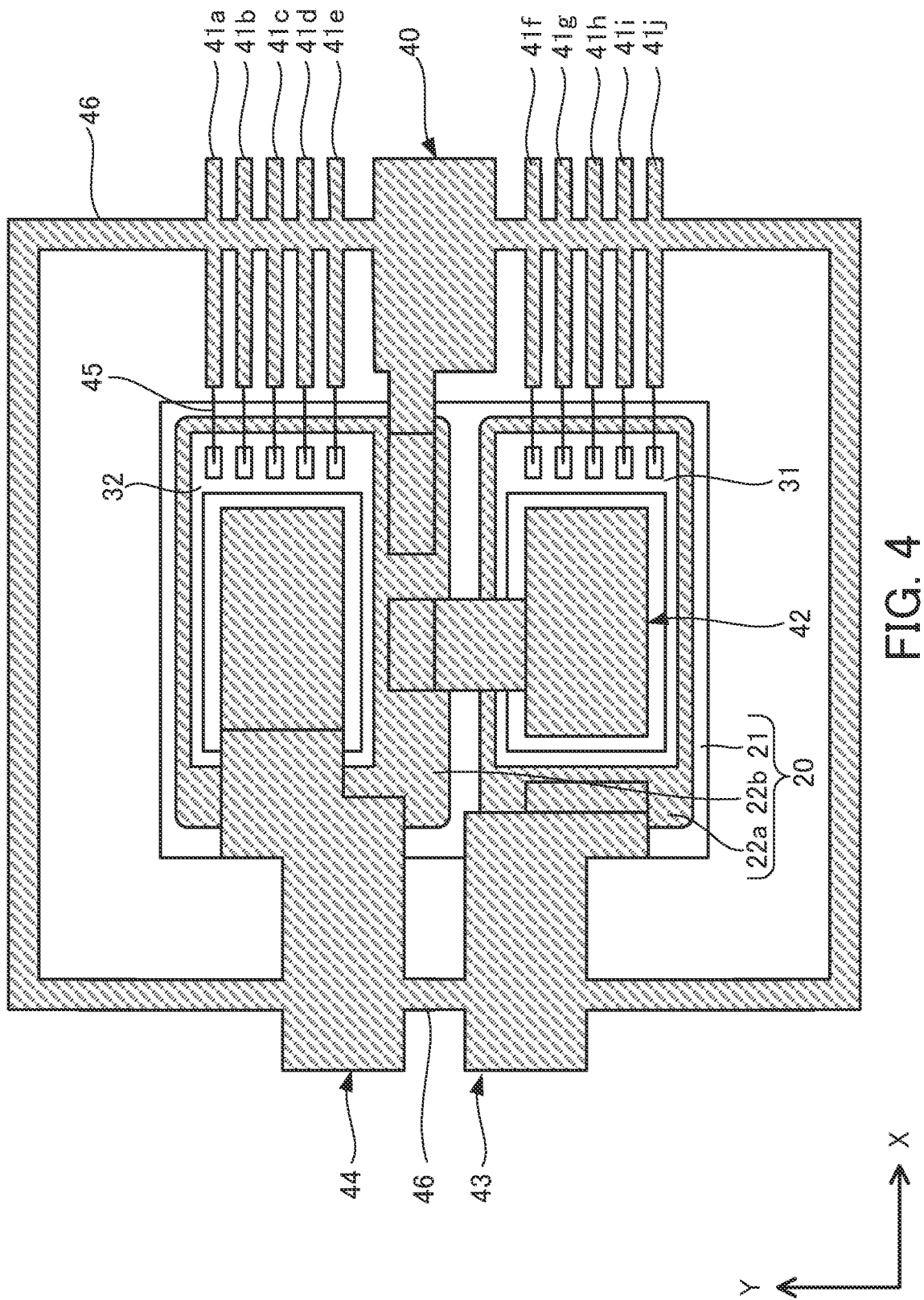
FIG. 4 is a first plan view illustrating a manufacturing process of the semiconductor device according to the first embodiment.
Figure 5:
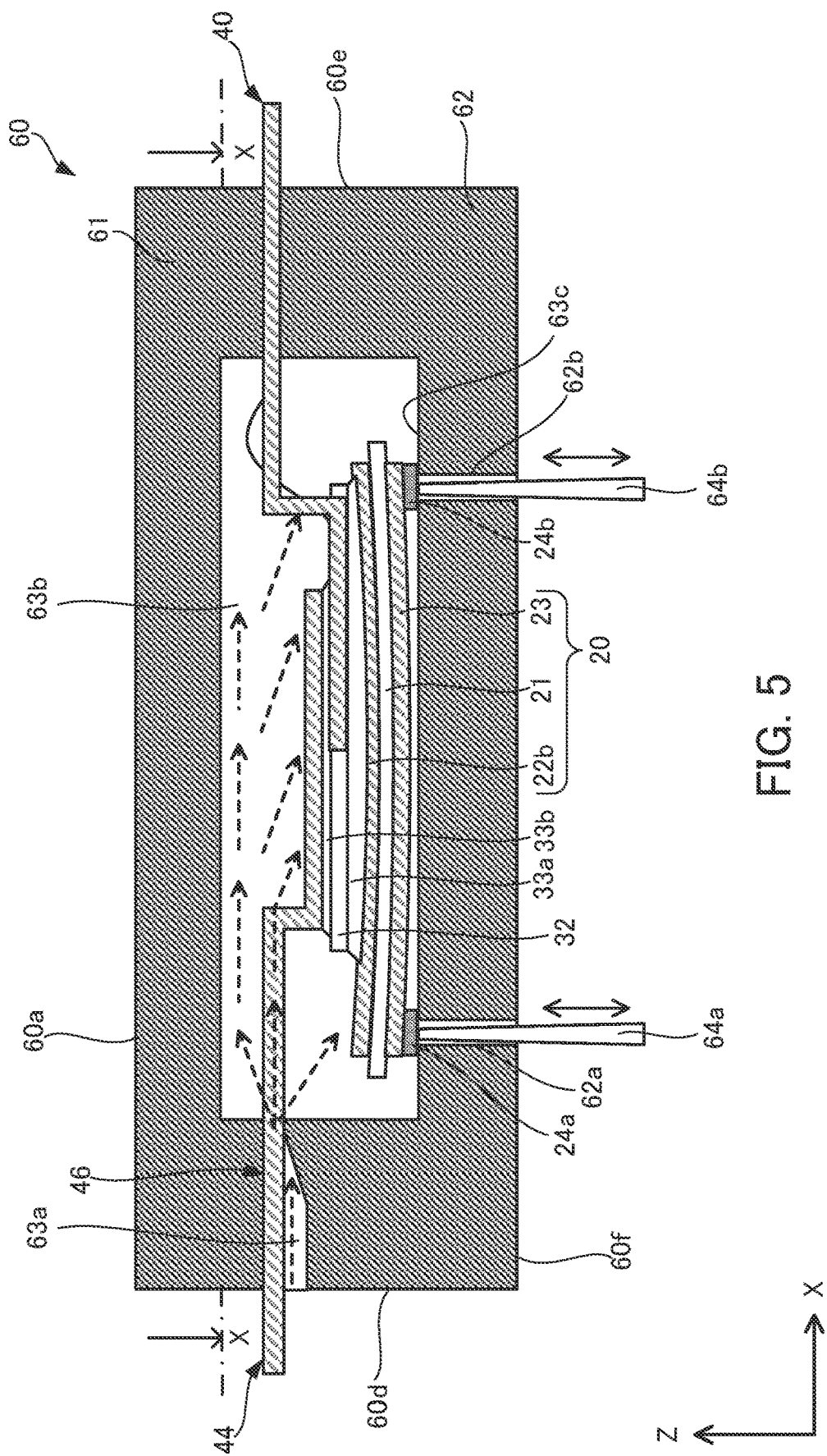
FIG. 5 is a first sectional side view illustrating the manufacturing process of the semiconductor device according to the first embodiment.
Figure 6:
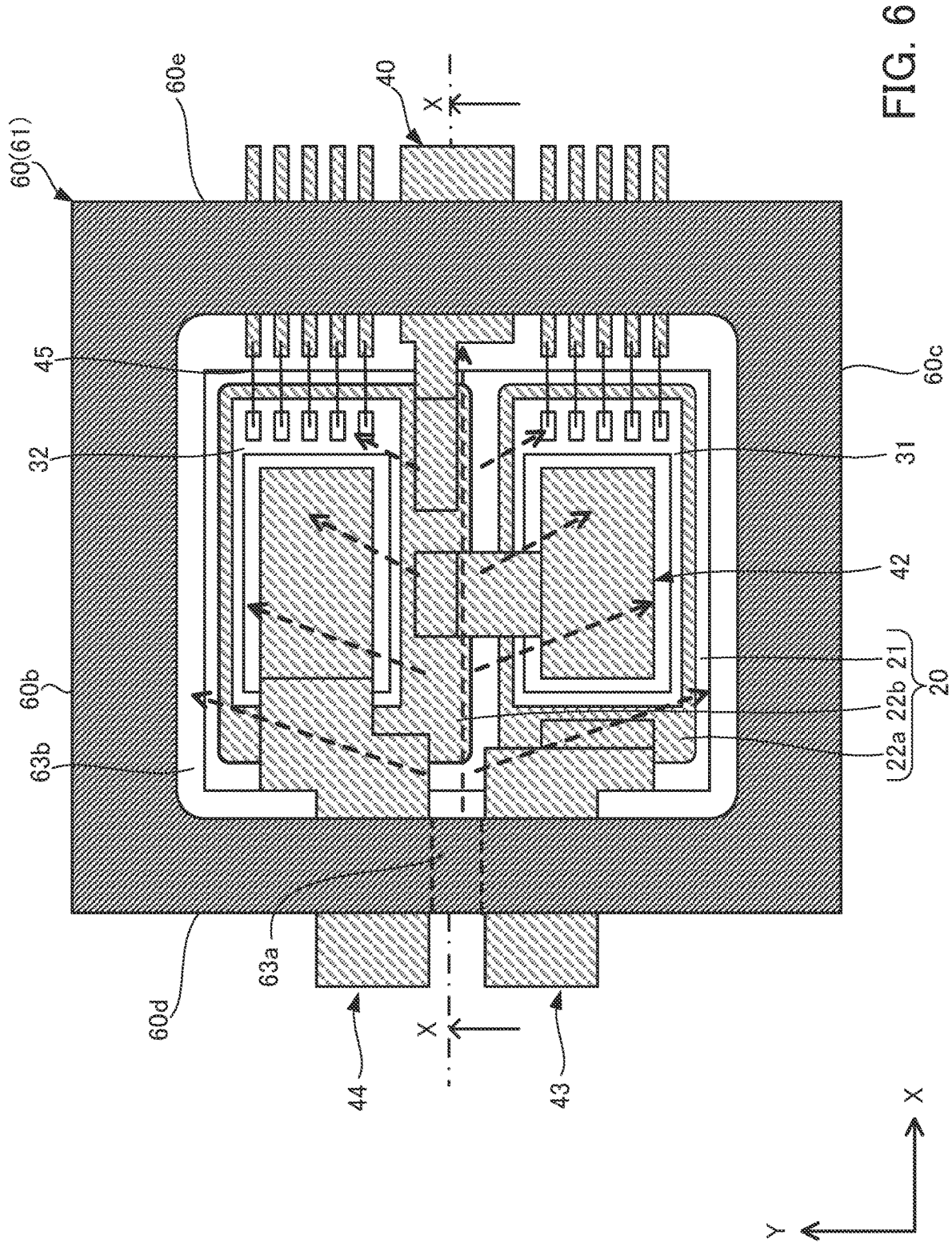
FIG. 6 is a second plan view illustrating the manufacturing process of the semiconductor device according to the first embodiment.
Figure 7:
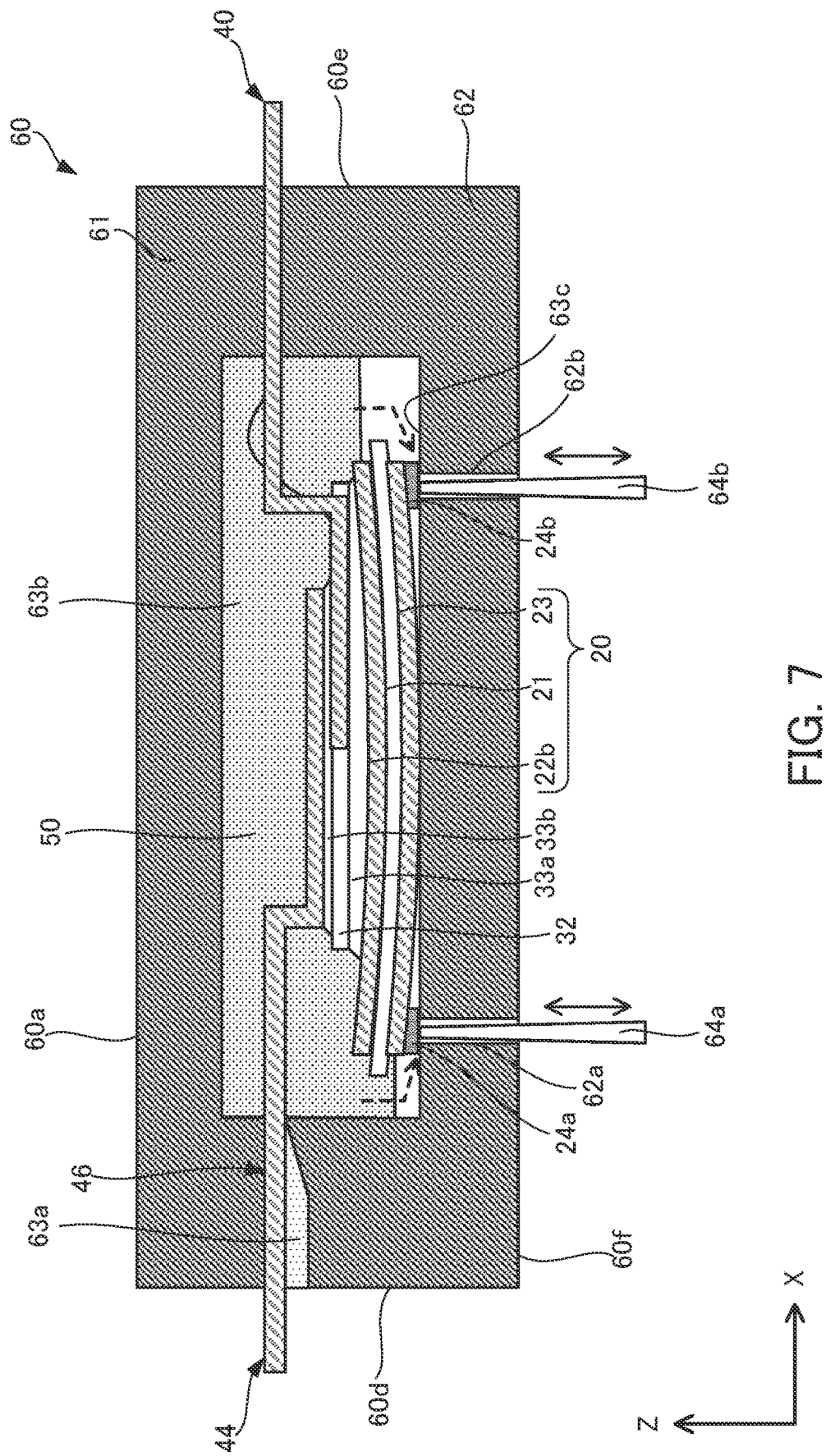
FIG. 7 is a second sectional side view illustrating the manufacturing process of the semiconductor device according to the first embodiment.

Next described is a method of manufacturing the semiconductor device 10, with reference to FIGS. 4 to 7. FIGS. 4 and 6 are plan views illustrating a manufacturing process of the semiconductor device according to the first embodiment. FIGS. 5 and 7 are sectional side views illustrating the manufacturing process of the semiconductor device according to the first embodiment. Note that FIGS. 5 to 7 omit a frame part of a tie bar 46 described later. FIG. 5 is a sectional side view of the semiconductor device along dashed-dotted line X-X of FIG. 6. FIG. 6 is a planar cross-sectional view of the semiconductor device along dashed-dotted line X-X of FIG. 5. FIG. 7 is a sectional side view corresponding to FIG. 6.

First, components of the semiconductor device 10 are prepared. The components are, for example, the insulated circuit board 20, the semiconductor chips 31 and 32, the lead frames 40, 41a to 41j, and 42 to 44, and the spacer parts 24a to 24d. In bonding the semiconductor chips 31 and 32 to the circuit patterns 22a and 22b of the insulated circuit board 20 via the solder 33a, heat causes convex-downward warping in the insulated circuit board 20, as mentioned earlier. The lead frames 40, 41a to 41j, 43, and 44 are integrally coupled to each other by the tie bar 46, which is a frame-based member. The lead frames 40 and 42 to 44 are connected to the insulated circuit board 20 and the semiconductor chips 31 and 32, as illustrated in FIG. 4, and corresponding parts in the lead frames 41a to 41j and the semiconductor chips 31 and 32 are mechanically and electrically connected to each other by the bonding wires 45. The insulated circuit board 20 with the semiconductor chips 31 and 32 and the lead frames 40 and 42 to 44 connected thereto may warp to be convex downward (in the −Z direction). The warpage amount Hc at this time is less than the warpage amount Hc after resin sealing. The warpage amount Hc is, for example, in the range of 10 μm to 150 μm inclusive, depending on the material and the like of the insulated circuit board 20.

Next, the insulated circuit board 20 with the semiconductor chips 31 and 32 and the lead frames 40, 41a to 41j, and 42 to 44 connected thereto in the above-described manner is laid out in a sealing mold 60, as illustrated in FIGS. 5 and 6. The sealing mold 60 has hardness and heat resistance, and is made of a material with a small thermal expansion coefficient as a major component. Such a material is, for example, a steel material. The sealing mold 60 is, for example, cubical in shape and has a mold top face 60a, mold lateral faces 60b to 60e, and a mold bottom face 60f. In addition, the sealing mold 60 is kept heated at a predetermined temperature to cure a sealing resin. The predetermined temperature is, for example, in the range of 100° C. and 200° C. inclusive.

The sealing mold 60 includes an upper mold 61 and a lower mold 62 separable at the mold lateral faces 60b to 60e. Each of the upper mold 61 and the lower mold 62 has a concave pit not penetrating through the bottom. The concave pits of the upper mold 61 and the lower mold 62 are aligned together to form a space (a cavity 63b) inside. The upper mold 61 includes a frame portion and a top cover portion. The rear face of the frame portion of the upper mold 61 (the face in contact with the lower mold 62) has a gate 63a from which the sealing member 50 is introduced and a groove serving as an outlet (not illustrated) from which excess resin is drained. The lower mold 62 includes a lower base portion and a frame portion that opposes the frame portion of the upper mold 61. The bottom face of the concave pit of the lower mold 62 has an installation surface 63c on which the insulated circuit board 20 is laid out. The installation surface 63c is flat (parallel to the X-Y plane). The front surface of the frame portion of the lower mold 62 (the face in contact with the upper mold 61) has grooves in which the lead frames 40, 41a to 41j, 43, and 44 and the tie bar 46 are placed.

The insulated circuit board 20 is placed in the concave pit of the lower mold 62 and then the upper mold 61 is placed on top of the lower mold 62, to thereby house the semiconductor chips 31 and 32 and the insulated circuit board 20 in the cavity 63b. At this time, the lead frames 40, 41a to 41j, 43, and 44 and the tie bar 46 are placed in the grooves on the front surface of the frame part of the lower mold 62, and the insulated circuit board 20 is installed on the installation surface 63c.

In addition, the lower mold 62 has four pressing holes individually provided at positions opposing the four corners of the metal plate 23 of the insulated circuit board 20. Note that FIG. 5 illustrates, of the four pressing holes, pressing holes 62a and 62b along the mold lateral faces 60b and 60c. The spacer parts 24a to 24d are individually located on the pressing holes on the installation surface 63c. Inside the pressing holes of the lower mold 62, pressing pins are provided in a movable manner in the Z direction. Note that FIG. 5 depicts pressing pins 64a and 64b provided in the pressing holes 62a and 62b. The pressing pins are initially housed inside the pressing holes, and then controlled such as to be simultaneously jutting out of all the pressing holes at a predetermined time and speed. After the sealing member 50 is hardened, the pressing pins 64a and 64b are thrust upward (in the +Z direction) from the bottom face of the lower mold 62, to thereby detach, from the lower mold 62, the insulated circuit board 20, the semiconductor chips 31 and 32 and the like encapsulated with the sealing member 50.

In installing the insulated circuit board 20 on the installation surface 63c of the lower mold 62, the spacer parts 24a to 24d are provided at the four corners of the metal plate 23. At this time, the tips of the pressing pins 64a and 64b are positioned in the same plane as the installation surface 63c of the lower mold 62. That is, the spacer parts 24a to 24d are located on the pressing holes 62a and 62b of the installation surface 63c. Alternatively, the tips of the pressing pins 64a and 64b are set to project above the installation surface 63c of the lower mold 62 by a predetermined amount in such a manner that the spacer parts 24a to 24d are caught on the tips of the pressing pins 64a and 64b. This prevents dislocation of the spacer parts 24a to 24d and resultant tilt of the insulated circuit board 20 from taking place when the sealing member 50 is injected, which in turn ensures stable sealing operation of the insulated circuit board 20.

The upper mold 61 has the gate 63a located higher (in the +Z direction) than at least the semiconductor chips 31 and 32 when the insulated circuit board 20 is set. In the case of FIG. 5, within the upper mold 61, the gate 63a is located above the level of the lead frame 40. The gate 63a is arranged in parallel in the X direction and communicates with the cavity 63b. In addition, as illustrated in FIG. 6, the gate 63a is located almost in the center of the left-hand side of the upper mold 61 in such a manner as to oppose the lead frame 40 on the tie bar 46.

The sealing mold 60 is opened by separating the upper mold 61 and the lower mold 62, and then the insulated circuit board 20 is placed in the lower mold 62. Subsequently, the sealing mold 60 is closed by covering the lower mold 62 with the upper mold 61. In this manner, the insulated circuit board 20 is placed in the cavity 63b of the sealing mold 60. At this time, the insulated circuit board 20 is heated by the sealing mold 60 to thereby warp to be convex downward. Note that the spacer parts 24a to 24d provided at the four corners of the insulated circuit board 20 are directly in contact with the installation surface 63c, and thus the insulated circuit board 20 except for the four corners of the metal plate 23 is lifted a little off the installation surface 63c. In this case, the gap between the central part of the metal plate 23 and the installation surface 63c is, for example, in the range of 10 μm to 200 μm.

While the sealing mold 60 is kept at a predetermined temperature, the sealing member 50 in an uncured state is injected from the gate 63a. The gate 63a is formed between the lead frames 43 and 44. The sealing member 50 injected from the gate 63a fills the cavity 63b along the dashed arrows in FIGS. 5 and 6. That is, the sealing member 50 injected from the gate 63a is introduced into the cavity 63b from between the lead frames 43 and 44. Subsequently, the sealing member 50 streams in from above and is poured over the insulated circuit board 20 and the semiconductor chips 31 and 32 and then moves in a direction from the mold lateral face 60d toward the mold lateral face 60e. While traveling in this way, the sealing member 50 also spreads toward the mold lateral faces 60b and 60c. The sealing member 50 thus seals the insulated circuit board 20 and the semiconductor chips 31 and 32. Here, the insulated circuit board 20 and the semiconductor chips 31 and 32 are pressed by the sealing member 50 toward the installation surface 63c. Therefore, the rear surface of the metal plate 23 of the insulated circuit board 20, lifted above the installation surface 63c is pressed against the installation surface 63c, and thus the region including the central part of the rear surface of the metal plate 23 is brought in contact with the installation surface 63c.

Further, when injected into the cavity 63b, the sealing member 50 reaches the lateral parts of the insulated circuit board 20, as indicated by the dashed arrows in FIG. 7 and fills the cavity 63b around the lateral parts of the insulated circuit board 20. In this case, although the insulated circuit board 20 warps to be convex downward, the spacer parts 24a to 24d are provided at the four corners of the metal plate 23. In addition, the insulated circuit board 20 is pressed by the sealing member 50 against the installation surface 63c. Therefore, the sealing member 50 filling the cavity 63b around the lateral parts of the insulated circuit board 20 is incapable of penetrating between the four corners of the warping insulated circuit board 20 and the installation surface 63c (see FIG. 3).

If no spacer parts 24a to 24d are provided, there are gaps between the four corners of the metal plate 23 and the installation surface 63 because the four corners of the insulated circuit board 20 are bent upward (in the +Z direction). Therefore, the sealing member 50 penetrates into the gaps. The sealing member 50 entering the gaps may press the insulated circuit board 20 upward (in the +Z direction) and penetrate deeper to reach near the center of the insulated circuit board 20. If the sealing member 50 having entered the gaps becomes cured, the sealing member 50 in the gaps becomes burrs. Because the burrs have poor thermal conductivity, the semiconductor device 10 with the burrs on the undersurface thereof has reduced heat dissipation. Especially, if the sealing member 50 penetrates to reach near the center of the insulated circuit board 20, which is located underneath the semiconductor chips 31 and 32, and then becomes cured, the semiconductor chips 31 and 32 may be damaged by overheating during operation of the semiconductor device 10. Deburring makes the manufacturing process cumbersome and complicated and therefore raises manufacturing costs. Thus, burr formation reduces reliability of the semiconductor device 10. In the case where the spacer parts 24a to 24d are provided, the sealing member 50 may still, in some cases, enter through the inner sides of the spacer parts 24a to 24d. However, because the insulated circuit board 20 is pressed onto the installation surface 63c by the sealing member 50 streaming in from above and poured over the insulated circuit board 20, the sealing member 50 does not reach all the way to the central part of the metal plate 23, above which the semiconductor chips 31 and 32 are located. In this case, even if burrs are formed, they have only a limited effect without compromising much of the reliability of the semiconductor device 10. In this manner, the sealing member 50 seals the lateral parts of the insulated circuit board 20 and the lateral parts of the spacer parts 24a to 24d, facing outside (spacer lateral parts).

When the sealing member 50 is cured or partially cured after being injected, the sealing mold 60 is opened and the pressing pins 64a and 64b are made to jut out. Herewith, the semiconductor device 10 with the insulated circuit board 20, the semiconductor chips 31 and 32, and the like sealed together is taken out of the sealing mold 60. Finally, excess resin left in the gate 63a, the outlet, and the like is removed and then the tie bar 46 is cut off, to thus obtain the semiconductor device 10 depicted in FIGS. 1 to 3.

Figure 8:
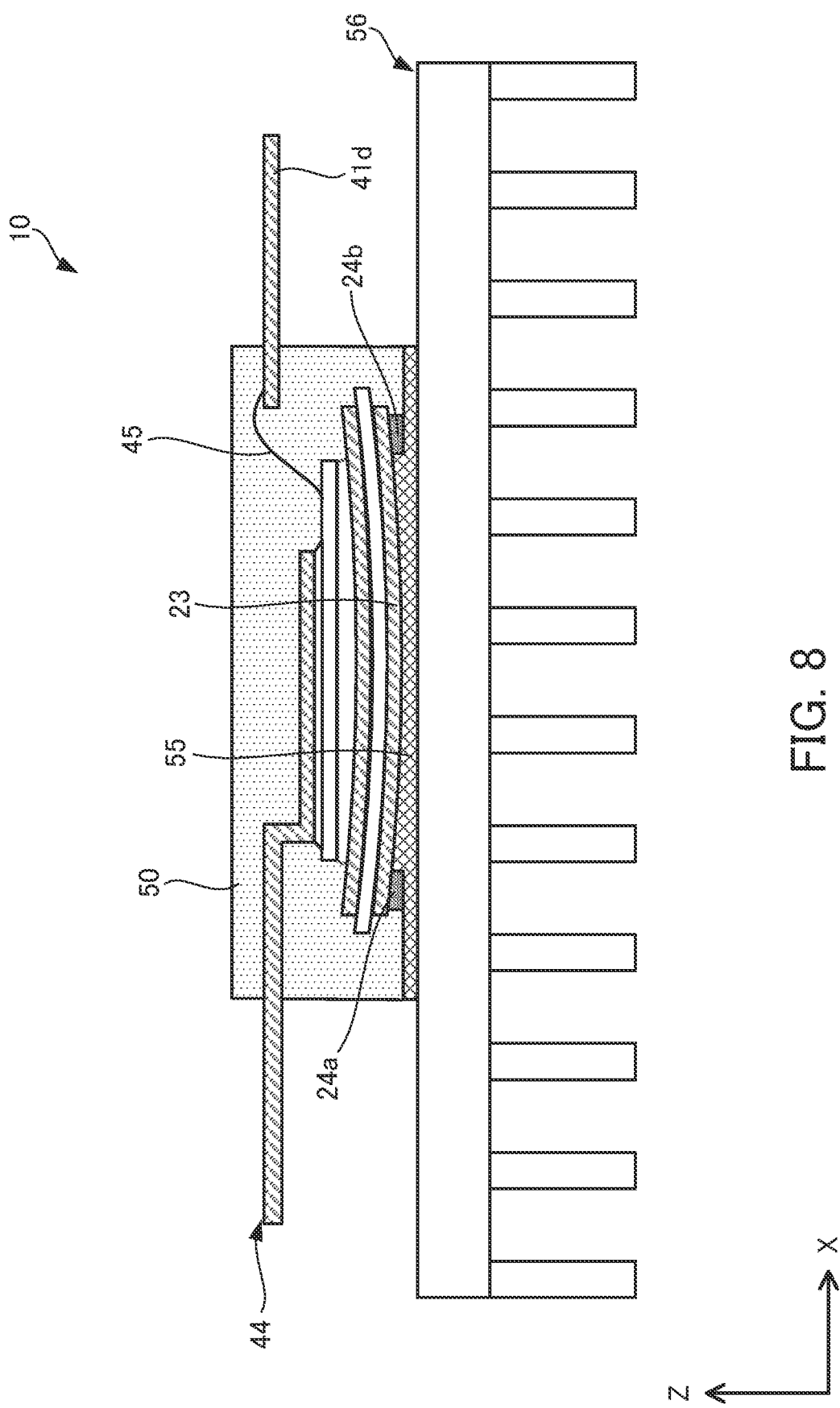
FIG. 8 is a sectional side view of the semiconductor device with a heatsink unit mounted thereon, according to the first embodiment.

Next described is the case of mounting a heatsink unit on the rear surface (the sealing bottom face 50f) of the foregoing semiconductor device 10, with reference to FIG. 8. FIG. 8 is a sectional side view of the semiconductor device with the heatsink unit mounted thereon, according to the first embodiment. Note that FIG. 8 depicts the case where the heatsink unit is mounted on the semiconductor device 10 corresponding to the sectional side view of FIG. 2.

A heatsink unit 56 is provided on the rear surface of the semiconductor device 10 via a thermal interface material (TIM) 55. The semiconductor device 10 and the heatsink unit 56 may be fastened together with bolts or the like (not illustrated). The heatsink unit 56 is made of a metal with excellent thermal conductivity. Such a metal is, for example, aluminum, iron, silver, copper, or an alloy containing at least one of these. As the heatsink unit 56, a fin, a heatsink with a plurality of fins, or a water cooling system may be used, for example. FIG. 8 illustrates the case where radiating fins are provided. In order to provide improved corrosion resistance, plating may be applied to coat the surface of the heatsink unit 56. In this case, a material used for plating is, for example, nickel, a nickel-phosphorus alloy, or a nickel-boron alloy. The TIM 55 is a thermal grease or a heat dissipation sheet. The thermal grease is, for example, silicone with a filler. The filler is, for example, ceramics or a metal. The heat dissipation sheet is, for example, a graphite sheet, an acrylic sheet, or a silicone sheet with a filler. The filler in this case is also, for example, ceramics or a metal. Note however that the TIM 55 is not limited to these and may be made of a metal such as solder or a brazing filler metal.

Even where the rear surface of the semiconductor device 10 warps and is not flat due to the presence of the spacer parts 24a to 24d, the provision of the TIM 55 on the rear surface of the semiconductor device 10 fills the gap between the rear surface of the semiconductor device 10 and the front surface of the heatsink unit 56 to connect them together. In this manner, the heatsink unit 56 is properly mounted on the rear surface of the semiconductor device 10.

The foregoing semiconductor device 10 includes the semiconductor chips 31 and 32 and the insulated circuit board in which the rectangular-shaped metal plate 23, the rectangular-shaped insulating plate 21, and the circuit patterns 22a and 22b are stacked sequentially. Here, the insulated circuit board 20 has the circuit patterns 22a and 22b on its front surface, above which the semiconductor chips 31 and 32 are positioned, and the metal plate 23 on its rear surface facing down, and warps to be convex downward. The semiconductor device 10 further includes the spacer parts 24a to 24d provided, in a plan view, at the four corners of the metal plate 23 in such a manner as to individually project downward. Encapsulating the foregoing insulated circuit board 20 placed in the cavity 63b with the sealing member 50 prevents penetration of the sealing member 50 into the four corners of the rear surface of the insulated circuit board 20. This prevents formation of burrs in the four corners of the rear surface of the insulated circuit board 20. Then, the prevention of formation of burrs reduces the degradation of heat dissipation of the semiconductor device 10 and thus reduces an increase in manufacturing costs of the semiconductor device 10. As a result, the reliability of the semiconductor device 10 is secured.

In addition, the heatsink unit 56 may be mounted on the rear surface of the semiconductor device 10 via the TIM 55. Even where the rear surface of the semiconductor device 10 warps and is not flat due to the presence of the spacer parts 24a to 24d, the use of the TIM 55 reliably connects the rear surface of the semiconductor device 10 to the heatsink unit 56. This results in improved heat dissipation of the semiconductor device 10.

Next described are various configurations of the spacer parts 24a to 24d.

[Modification 1]

Figure 9:
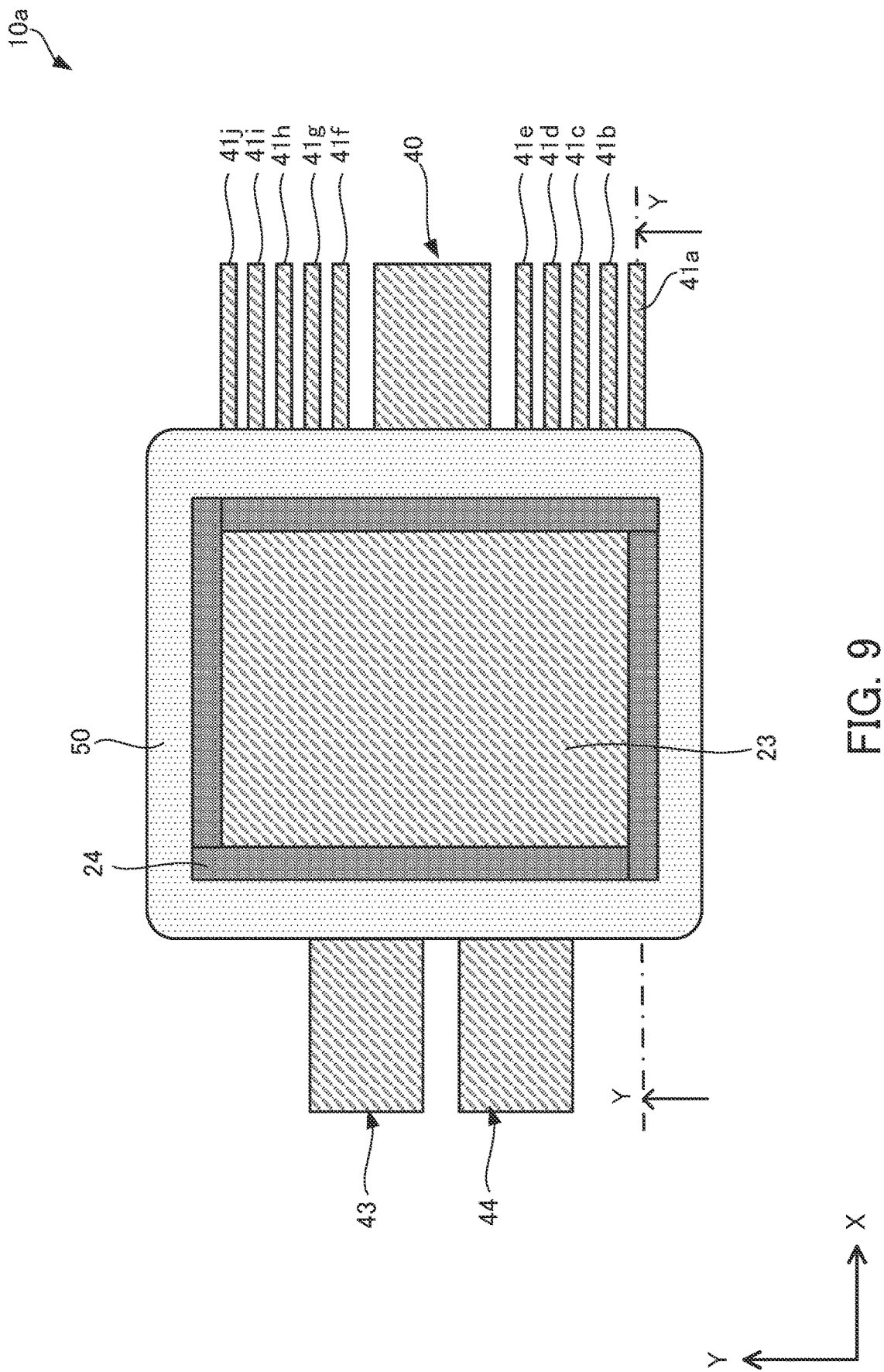
FIG. 9 is a rear view of a semiconductor device according to modification 1 of the first embodiment.
Figure 10:
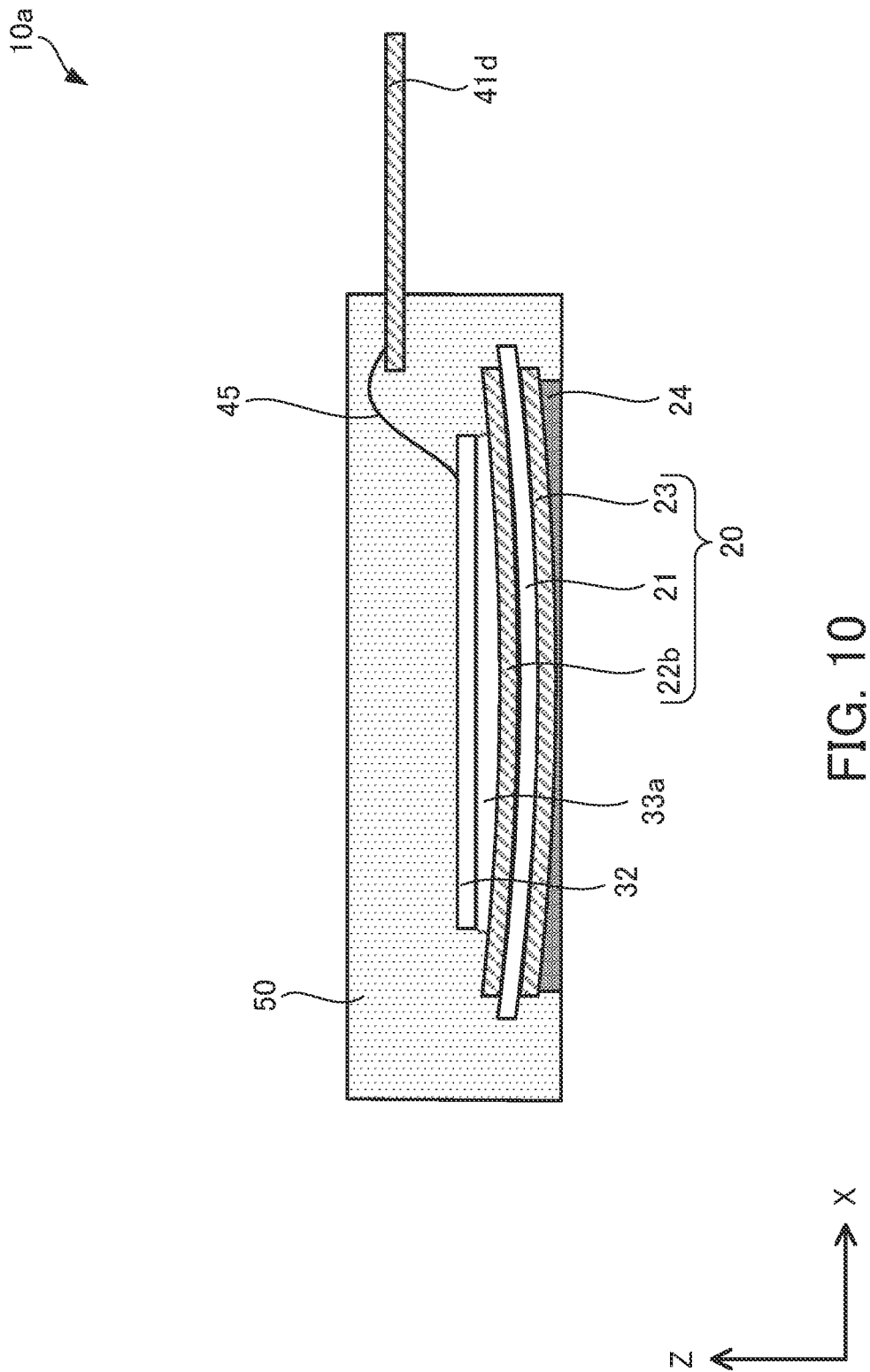
FIG. 10 is a sectional side view of the semiconductor device according to modification 1 of the first embodiment.

Referring to FIGS. 9 and 10, modification 1 is described next, which is directed to the case where a spacer part is provided along the outer edges of the metal plate 23 (including the four corners) of the insulated circuit board 20. FIG. 9 is a rear view of a semiconductor device according to modification 1 of the first embodiment. FIG. 10 is a sectional side view of the semiconductor device according to modification 1 of the first embodiment. Note that FIG. 10 is a cross-sectional view of the semiconductor device along dashed-dotted line Y-Y of FIG. 9. Like components to those of the semiconductor device 10 are denoted by like reference numerals.

In a semiconductor device 10a, a spacer part 24 is formed along the outer edges of the metal plate 23 of the insulated circuit board 20 in such a manner as to circle around the central part of the metal plate 23. The spacer part 24 may be made up of individual parts each formed for one outer edge side of the metal plate 23, or may be integrally arranged in a circular pattern to surround the central part of the metal plate 23. Modification 1 illustrates the case of providing the spacer part 24 for each outer edge side of the metal plate 23.

Each spacer part 24 here has such a height as to follow the warpage of the insulated circuit board 20. That is, when viewed in lateral projection, as illustrated in FIG. 10, the spacer part 24 is arranged to be lowest in height at a location corresponding to the central part of the metal plate 23 and becomes higher at a location closer to each of the four corners of the metal plate 23. The height of the spacer part 24 here refers to the distance from the installation surface 63c to the metal plate 23 when the spacer part 24 is placed on the installation surface 63c.

In manufacturing the semiconductor device 10a, the insulated circuit board 20 is set on the installation surface 63c of the lower mold 62 of the sealing mold 60 via the spacer part 24 (see FIG. 5). Also, in this case, the spacer part 24 is provided to support the four corners of the metal plate 23 of the insulated circuit board 20. The sealing member 50 is injected from the gate 63a to fill the cavity 63b with the sealing member 50. The insulated circuit board 20 and the semiconductor chips 31 and 32 are pressed by the sealing member 50 toward the installation surface 63c. Therefore, the rear surface of the metal plate 23 of the insulated circuit board 20 is pressed against the installation surface 63c, and thus the region including the central part of the rear surface of the metal plate 23 is brought in contact with the installation surface 63c. As a result, as compared with the case of manufacturing the semiconductor device 10, penetration of the sealing member 50 between the metal plate 23 and the installation surface 63c is further reduced. The semiconductor device 10a manufactured in this manner ensures reliable prevention of burr formation and thus offers further improved reliability compared with the semiconductor device 10.

[Modification 2]

Figure 11:
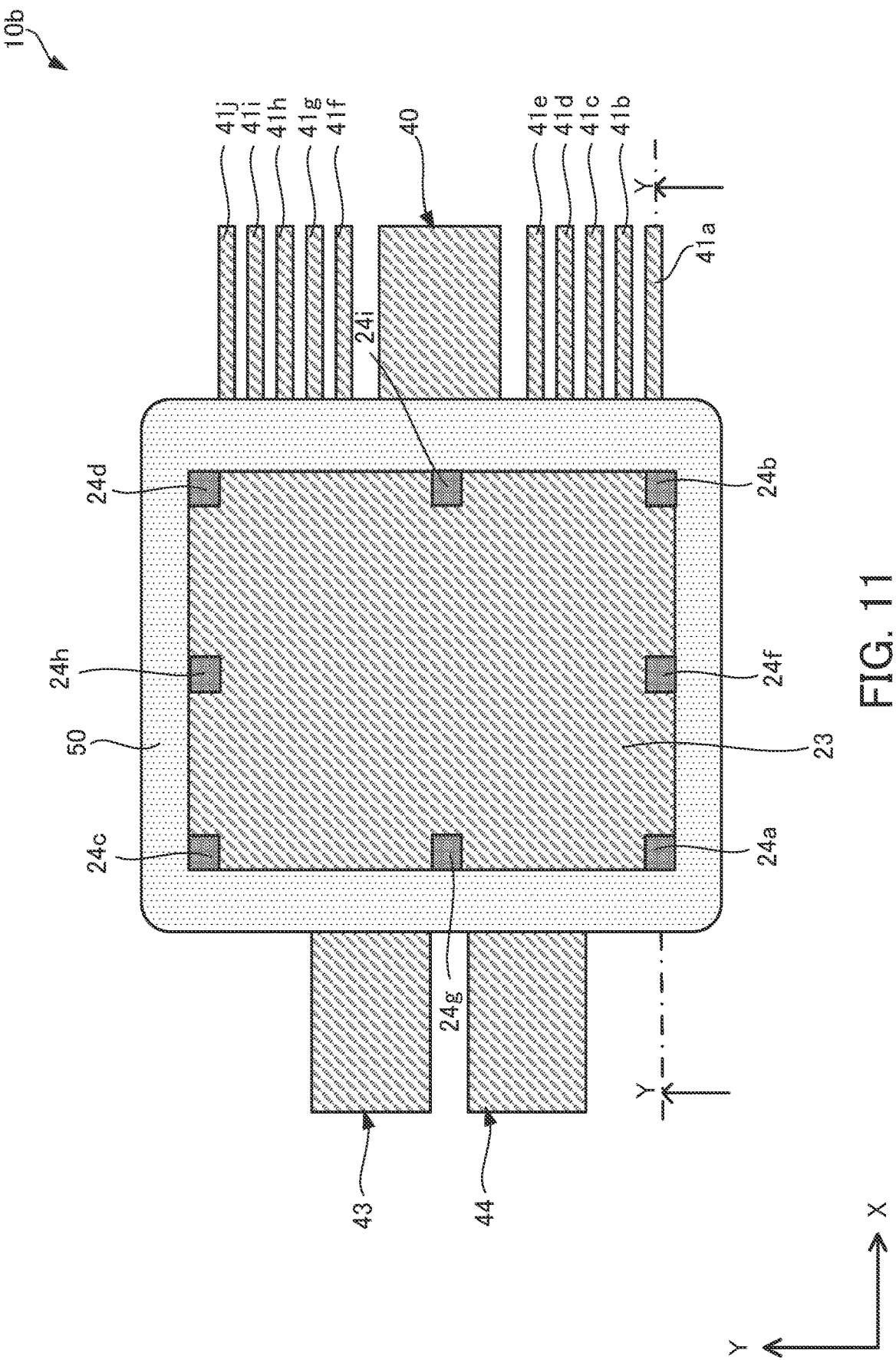
FIG. 11 is a rear view of a semiconductor device according to modification 2 of the first embodiment.
Figure 12:
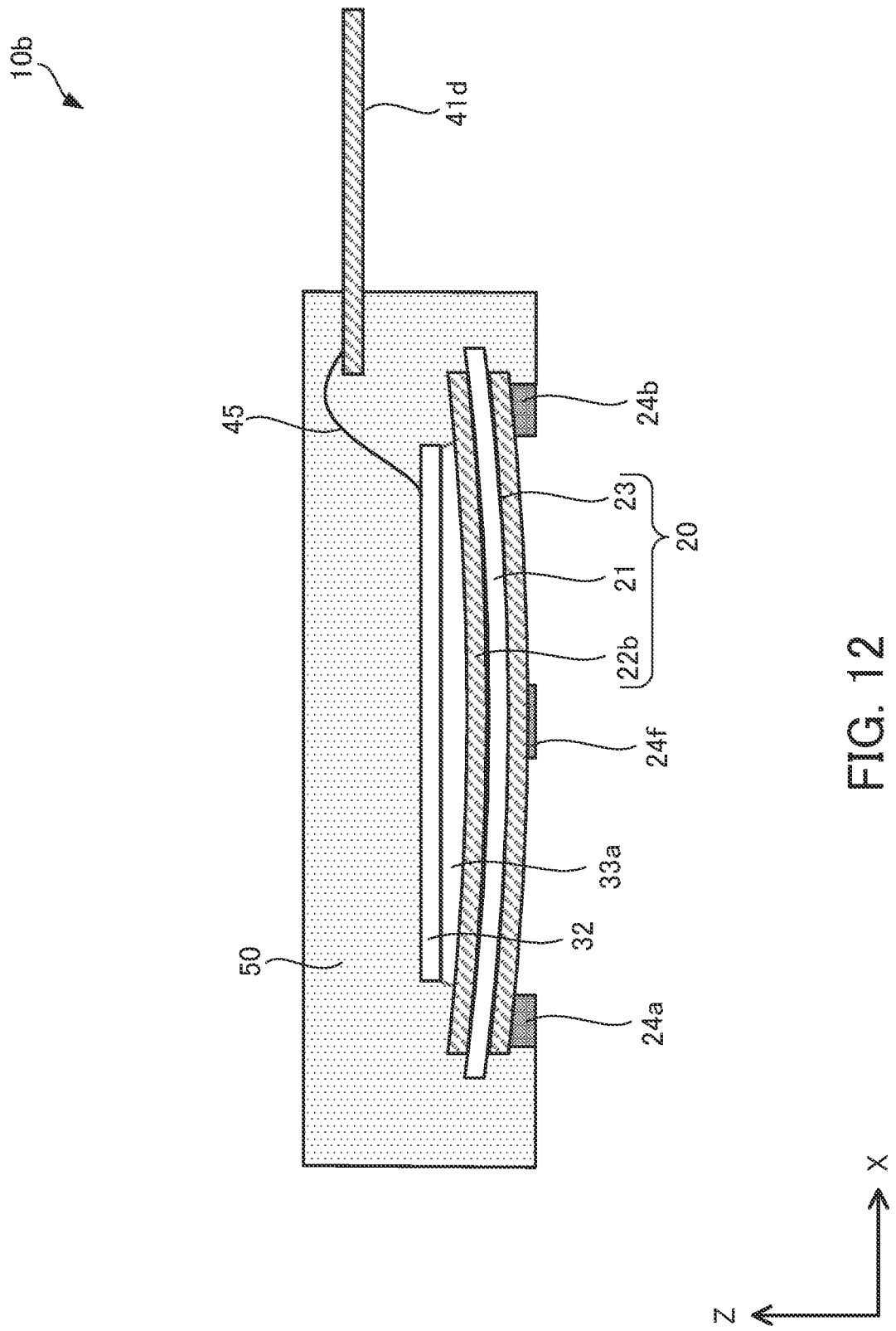
FIG. 12 is a sectional side view of the semiconductor device according to modification 2 of the first embodiment.

Referring to FIGS. 11 and 12, modification 2 is described next, which is directed to the case where a larger number of spacer parts than that of the semiconductor device 10 is provided along the outer edges of the metal plate 23 of the insulated circuit board 20. FIG. 11 is a rear view of a semiconductor device according to modification 2 of the first embodiment. FIG. 12 is a sectional side view of the semiconductor device according to modification 2 of the first embodiment. FIG. 12 is a cross-sectional view of the semiconductor device along dashed-dotted line Y-Y of FIG. 11. Note that like components to those of the semiconductor device 10 are denoted by like reference numerals.

A semiconductor device 10b differs from the semiconductor device 10 in which additional spacer parts 24f to 24i are provided midway between the spacer parts 24a to 24d, along the individual outer edges of the metal plate 23 of the insulated circuit board 20. Modification 2 illustrates the case of providing one additional spacer part (one of the spacer parts 24f to 24i) for each outer edge of the metal plate 23 between the spacer parts 24a to 24d; however, the number of in between spacer parts is not limited to one, and two or more additional spacer parts may be provided for each outer edge. Alternatively, a different number of additional spacer parts may be provided for outer edges with greater warpage in the insulated circuit board 20.

The spacer parts 24a to 24d and 24f to 24i each have such a height as to follow the warpage of the insulated circuit board 20. That is, as illustrated in FIG. 12, the spacer parts 24a to 24d are arranged to be greater in height than the spacer parts 24f to 24i when viewed in lateral projection. The height of each spacer part here refers to the distance from the installation surface 63c to the metal plate 23 when the spacer parts 24a to 24d and 24f to 24i are placed on the installation surface 63c.

In manufacturing the semiconductor device 10b, the insulated circuit board 20 is set on the installation surface 63c of the lower mold 62 of the sealing mold 60 via the spacer parts 24a to 24d and 24f to 24i. Note that the lower mold 62 is provided with pressing holes and pressing pins corresponding to the spacer parts 24*a* to 24*d* and 24*f* to 24*i* to be placed.

Also, in this case, the sealing member 50 is injected from the gate 63*a* to fill the cavity 63*b* with the sealing member 50. The insulated circuit board 20 and the semiconductor chips 31 and 32 are pressed by the sealing member 50 toward the installation surface 63*c*. Therefore, the rear surface of the metal plate 23 of the insulated circuit board 20 is pressed against the installation surface 63*c*, and thus the region including the central part of the rear surface of the metal plate 23 is brought in contact with the installation surface 63*c*. As a result, as compared with the case of manufacturing the semiconductor device 10, penetration of the sealing member 50 between the metal plate 23 and the installation surface 63*c* is further reduced. The semiconductor device 10*b* manufactured in this manner ensures reliable prevention of burr formation and thus offers further improved reliability compared with the semiconductor device 10.

[Modification 3]

Figure 13:
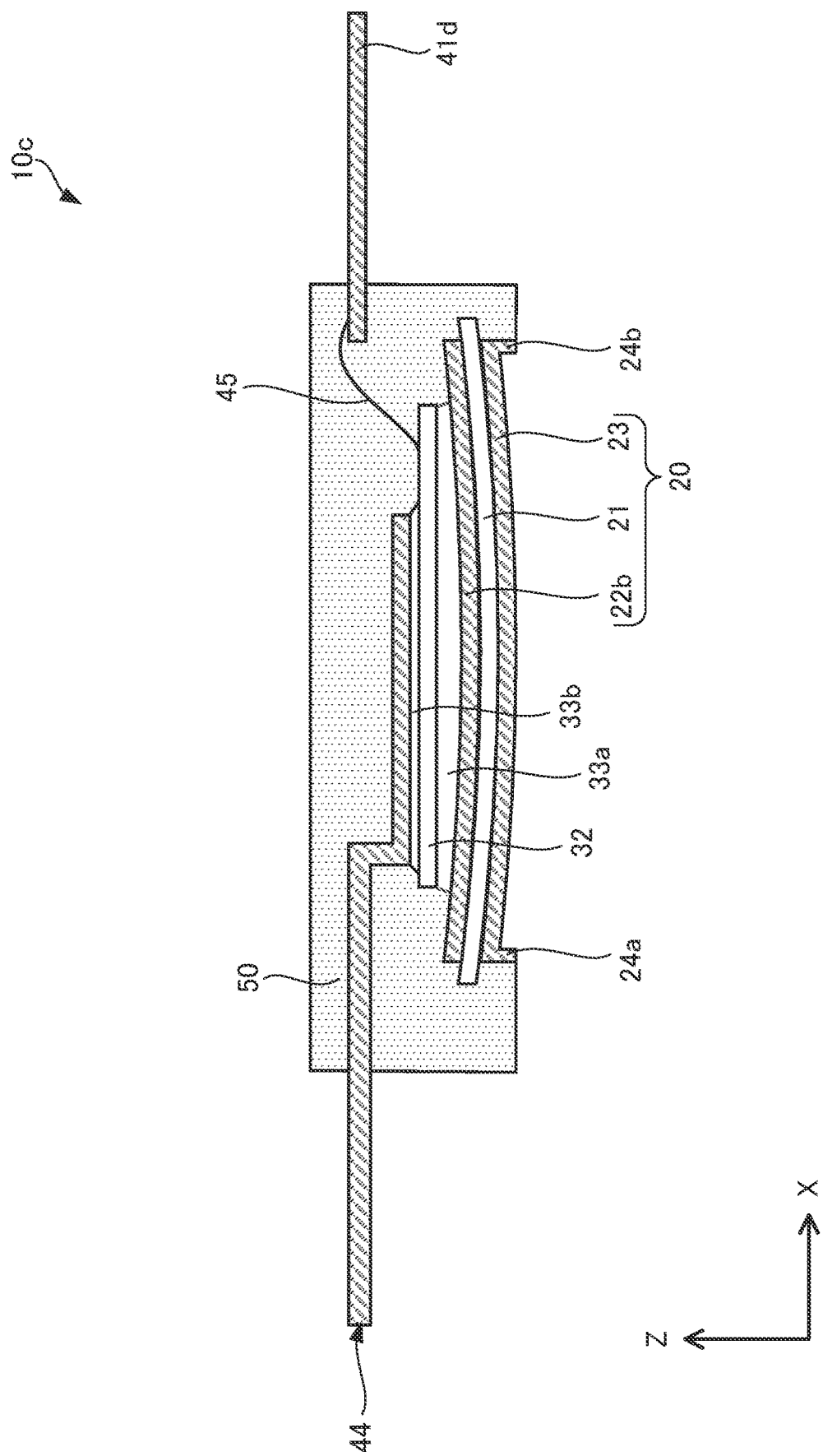
FIG. 13 is a sectional side view of a semiconductor device according to modification 3 of the first embodiment.

Referring to FIG. 13, modification 3 is described next, which is directed to the case where spacer parts are integrally formed with the metal plate 23 of the insulated circuit board 20 at the outer edges of the metal plate 23. FIG. 13 is a sectional side view of the semiconductor device according to modification 3 of the first embodiment. Note that FIG. 13 corresponds to the location of the cross section of FIG. 2. In FIG. 13, like components to those of the semiconductor device 10 are denoted by like reference numerals.

In a semiconductor device 10*c*, the spacer parts 24*a* to 24*d* integrally formed with the metal plate 23 are provided at the four corners of the metal plate 23 of the insulated circuit board 20. The spacer parts 24*a* to 24*d* are formed by half etching on the principal surface of the metal plate 23 in such a manner that convex portions are left at the four corners of the metal plate 23. Note that the configuration of the spacer parts on the metal plate 23 of the insulated circuit board 20 is not limited to that of the spacer parts 24*a* to 24*d*. Spacer parts arranged in a circular pattern, as illustrated in modification 1, may be used instead. Alternatively, a plurality of spacer parts provided both at and between the four corners of the metal plate 23, as illustrated in modification 2, may be used.

In the case of manufacturing the foregoing semiconductor device 10*c*, the spacer parts 24*a* to 24*d* produce the same effect as with the semiconductor device 10.

[Modification 4-1]

Figure 14:
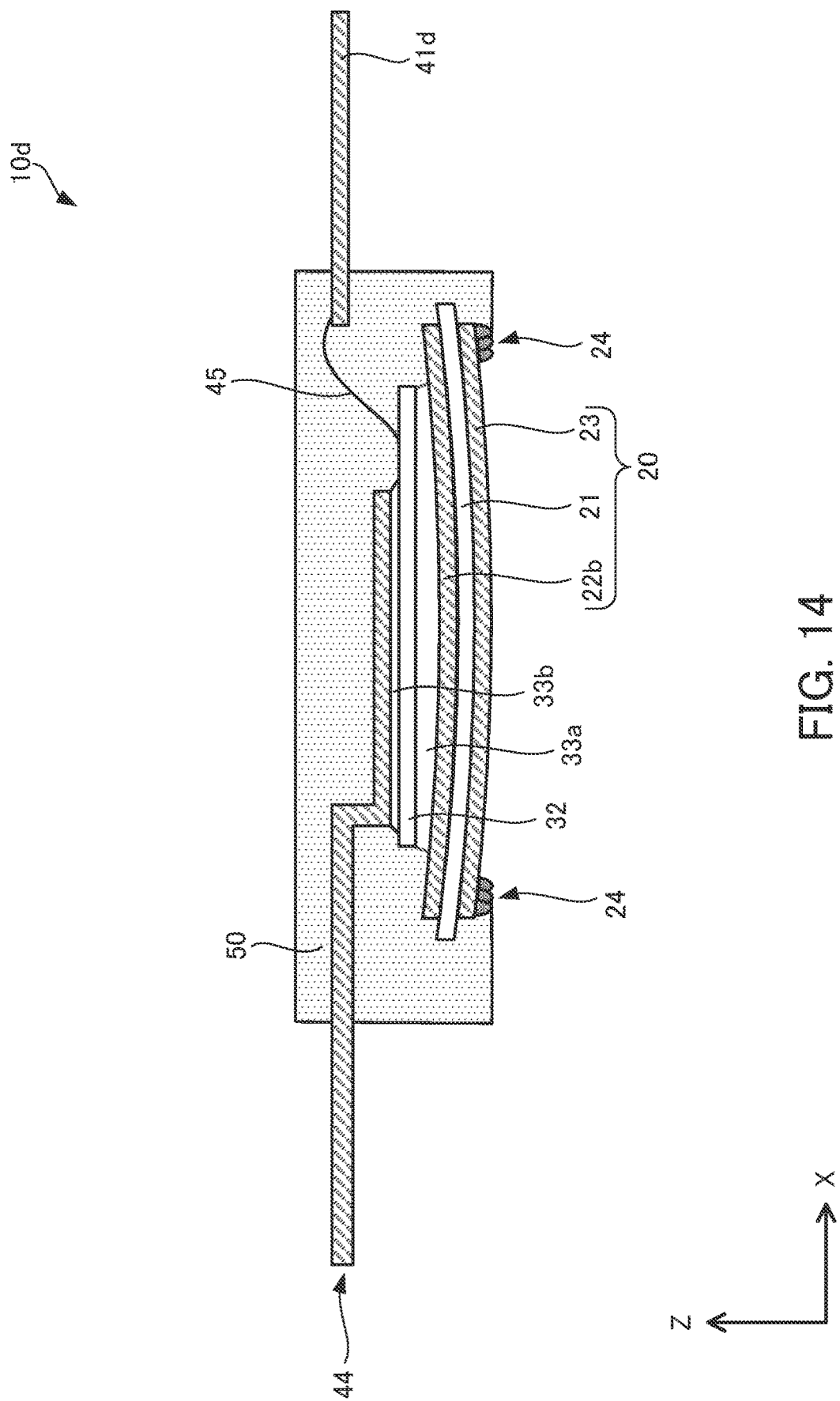
FIG. 14 is a sectional side view of a semiconductor device according to modification 4-1 of the first embodiment.
Figure 15:
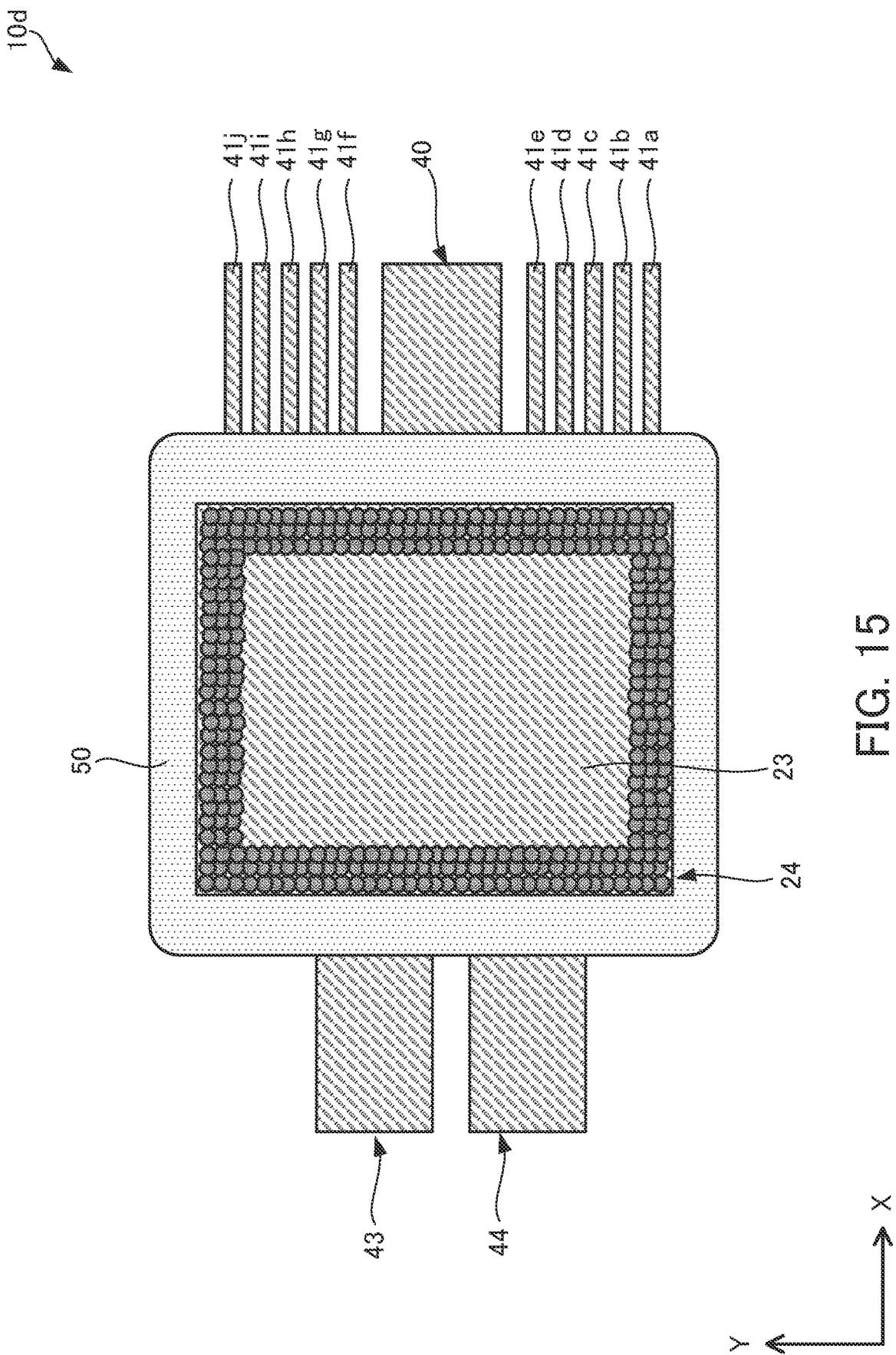
FIG. 15 is a rear view of the semiconductor device according to modification 4-1 of the first embodiment.

Referring to FIGS. 14 and 15, modification 4-1 is described next, which is directed to the case where a spacer part made up of a plurality of fine projections is provided along the outer edges of the metal plate 23 of the insulated circuit board 20. FIG. 14 is a sectional side view of a semiconductor device according to modification 4-1 of the first embodiment. FIG. 15 is a rear view of the semiconductor device according to modification 4-1 of the first embodiment. Note that FIG. 14 corresponds to the location of the cross section of FIG. 2. In FIGS. 14 and 15, like components to those of the semiconductor device 10 are denoted by like reference numerals.

In a semiconductor device 10*d*, the spacer part 24 is formed along the outer edges of the metal plate 23 of the insulated circuit board 20 in such a manner as to encompass the central part of the metal plate 23. The spacer part 24 formed along the outer edges of the metal plate 23 is made up of a plurality of fine projections. The apical end of each of the fine projections is crushed to be round. As illustrated in FIG. 15, a plurality of such fine projections is formed along the outer edges of the metal plate 23 of the insulated circuit board 20 to enclose the central part of the metal plate 23.

In the semiconductor device 10*d*, the sealing member 50 seals lateral parts of the fine projections of the spacer part 24, facing outside (spacer lateral parts), as well as the entire lateral periphery of the insulated circuit board 20. Also, in the semiconductor device 10*d*, the sealing bottom face 50*f* lies in the same plane as the apical ends of the spacer part 24 and the central part of the rear surface of the insulated circuit board 20.

Figure 16:
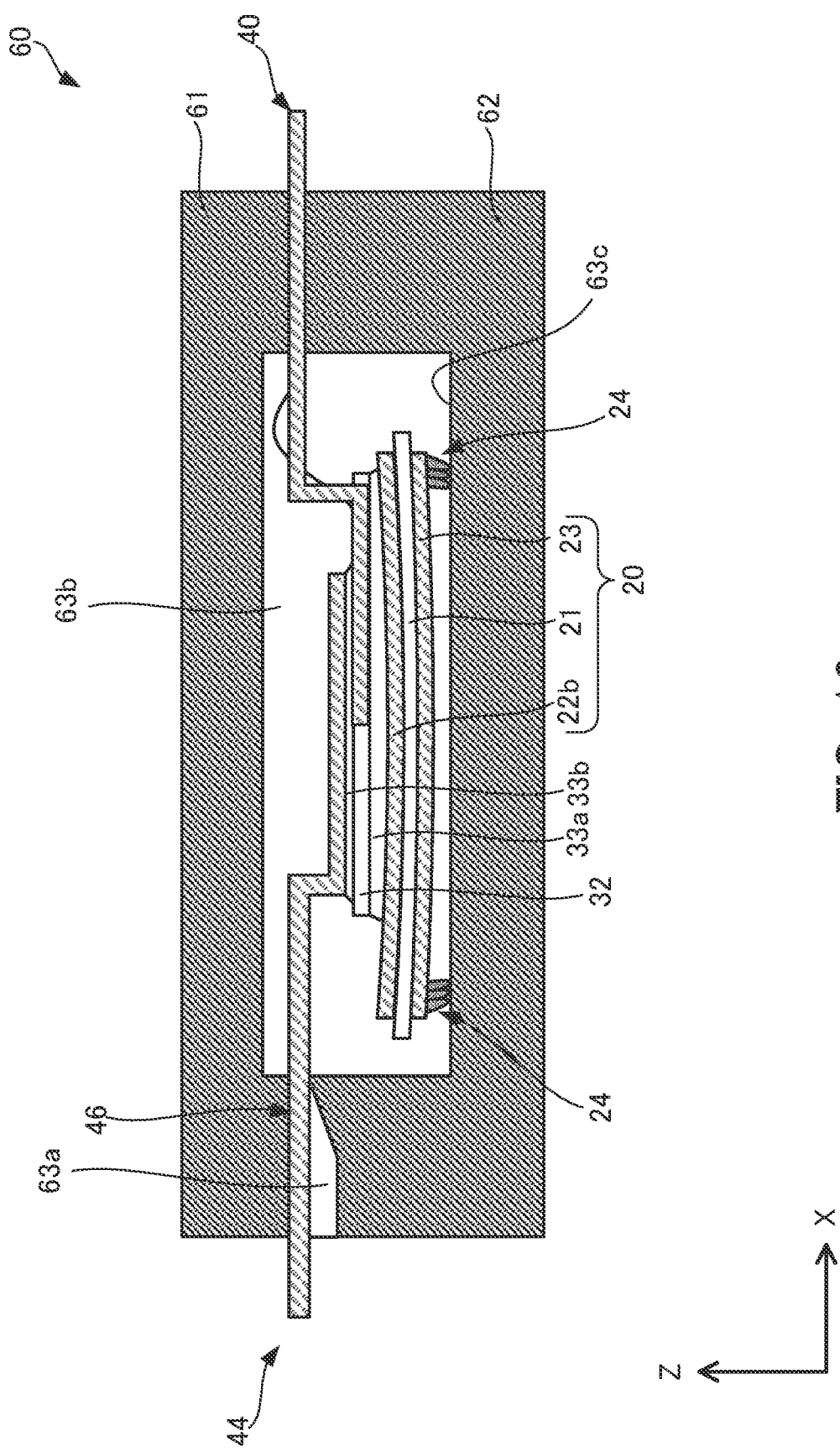
FIG. 16 is a first sectional side view illustrating a manufacturing process of the semiconductor device according to modification 4-1 of the first embodiment.
Figure 17:
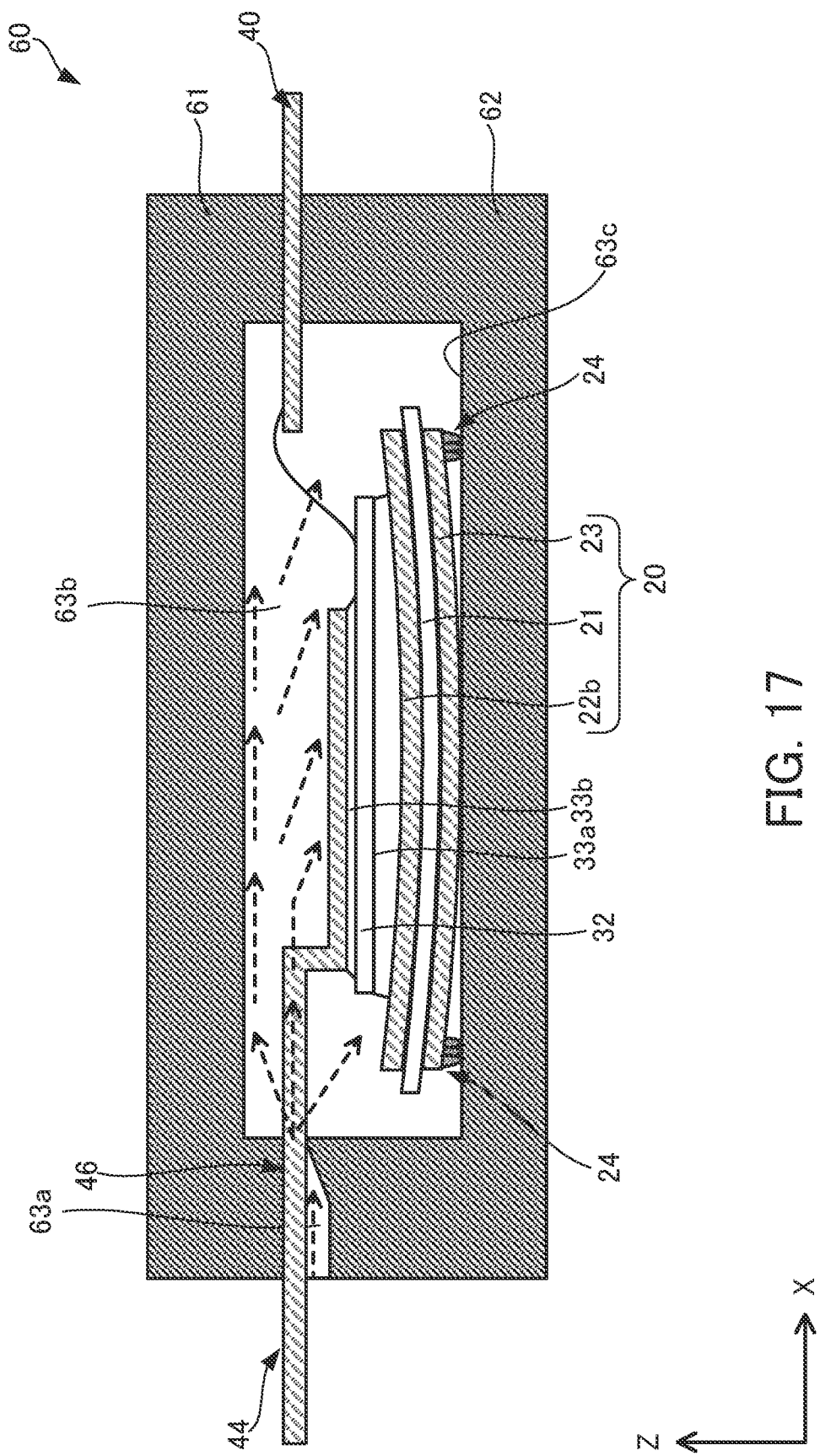
FIG. 17 is a second sectional side view illustrating the manufacturing process of the semiconductor device according to modification 4-1 of the first embodiment.
Figure 18:
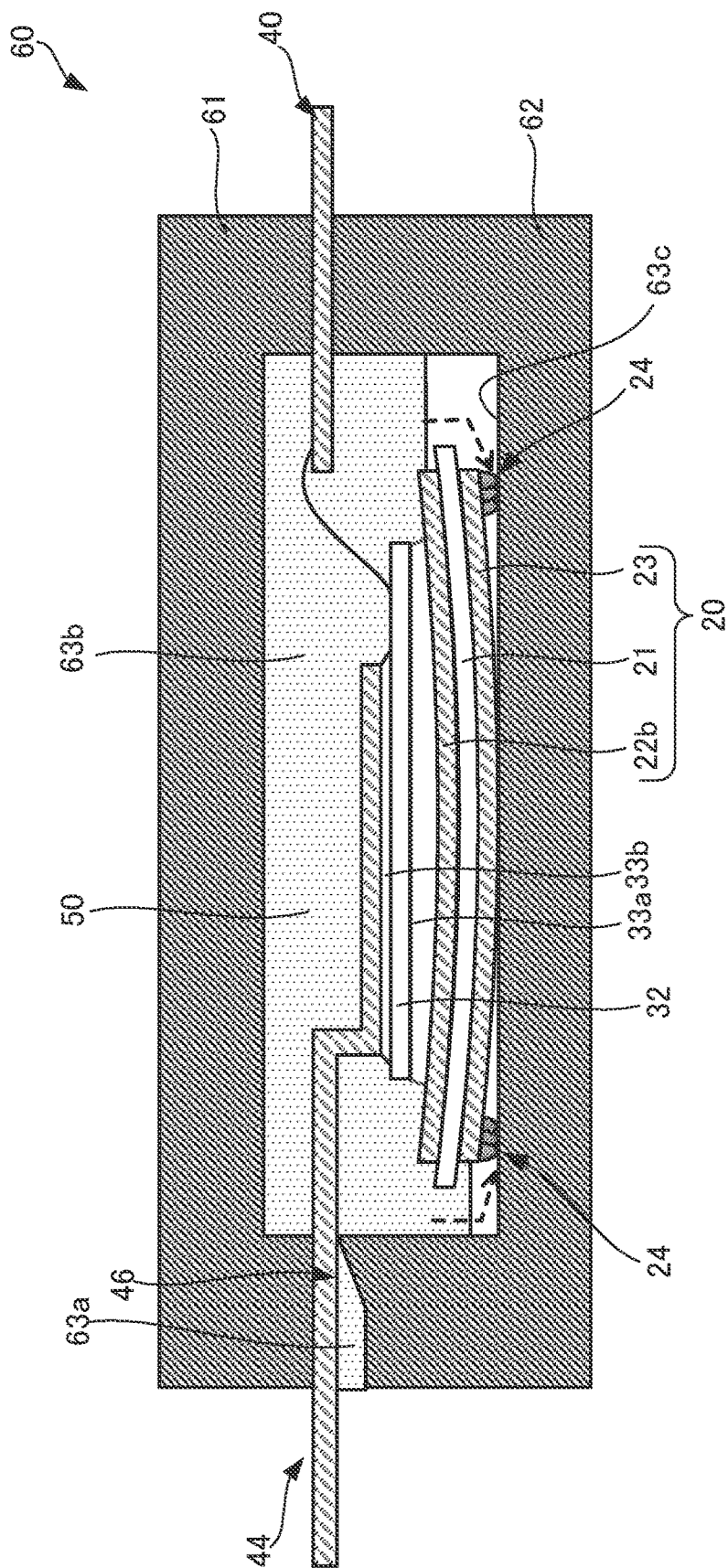
FIG. 18 is a third sectional side view illustrating the manufacturing process of the semiconductor device according to modification 4-1 of the first embodiment.

Next described is a method of manufacturing the foregoing semiconductor device 10*d*, with reference to FIGS. 16 to 18. FIGS. 16 to 18 are cross-sectional views illustrating the manufacturing process of the semiconductor device according to modification 4-1 of the first embodiment.

First, a plurality of fine spinous projections is formed by metal working along the outer edges of the metal plate 23 of the insulated circuit board 20 (see FIG. 14 for the location of the formation). That is, each fine projection is shaped like a protruding needle with sharp-pointed summit. In this case, the metal working is, for example, emboss processing, laser beam machining, or sandblasting. Taking warpage of the insulated circuit board 20 into consideration, the fine spinous projections are formed in such a manner that their apical ends face toward the center.

As illustrated in FIG. 4, the semiconductor chips 31 and 32, the lead frames 40, 41*a* to 41*j*, 43, and 44 coupled to the tie bar 46, and the lead frame 42 are connected to the insulated circuit board 20 produced in the above-described manner.

Next, the insulated circuit board 20 with the lead frames 40, 41*a* to 41*j*, and 42 to 44 and the like thus connected thereto is placed in the sealing mold 60, as illustrated in FIG. 16. The entire rear surface of the insulated circuit board 20 (the metal plate 23) housed in the cavity 63*b* is lifted off the installation surface 63*c* by the spacer part 24 with the plurality of fine spinous projections. Note that the lower mold 62 of the sealing mold 60 according to modification 4-1 is not provided with pressing holes and pins.

In the sealing mold 60 with the insulated circuit board 20 set in the above-described manner, the sealing member 50 in a molten state is injected from the gate 63*a*. By heat, the insulated circuit board 20 warps to be convex downward.

The sealing member 50 injected from the gate 63*a* flows along the dashed arrows in FIG. 17 (see FIG. 6 for a plan view) and fills the cavity 63*b*. As described in FIGS. 5 and 6 of the first embodiment, the insulated circuit board 20 and the semiconductor chips 31 and 32 are pressed by the sealing member 50 toward the installation surface 63*c*. Therefore, the fine spinous projections of the spacer part 24 are crushed under pressure, as illustrated in FIG. 18. The rear surface of the metal plate 23 of the insulated circuit board 20, lifted off the installation surface 63*c* is pressed against the installation surface 63*c*, and thus the region including the central part of the rear surface of the metal plate 23 is brought in contact with the installation surface 63*c*. The crushed fine projections are densely packed together to close gaps between them.

Further, when injected into the cavity 63*b*, the sealing member 50 reaches the lateral parts of the insulated circuit board 20 and fills the cavity 63*b* around the lateral parts, as described above in FIG. 7 of the first embodiment. In this case, although the insulated circuit board 20 warps to be convex downward, the spacer part 24 is provided along the outer edges of the metal plate 23. In addition, the insulated circuit board 20 is pressed by the sealing member 50 against the installation surface 63c. The fine spinous projections of the spacer part 24 are further crushed under pressure, as illustrated in FIG. 18. The sealing member 50 filling the cavity 63b around the lateral parts of the insulated circuit board 20 is incapable of penetrating between the four corners of the warping insulated circuit board 20 and the installation surface 63c. Hence, the sealing member 50 seals the lateral parts of the insulated circuit board 20 and those of the fine projections of the spacer part 24, facing outside. Thus, the insulated circuit board 20, the semiconductor chips 31 and 32, and the like are sealed together, and then no longer needed frames such as the tie bar 46 are removed, to obtain the semiconductor device 10d illustrated in FIGS. 14 and 15.

Note that modification 4-1 illustrates the case where the spacer part 24 is made up of a plurality of fine projections provided along the outer edges of the metal plate 23 of the insulated circuit board 20; however, this is merely an example and a plurality of fine projections may be formed as the spacer part 24 at each of the four corners of the metal plate 23 of the insulated circuit board 20, as depicted in FIG. 3. Alternatively, a plurality of fine projections may be provided as the spacer part 24 both at and between the four corners of the metal plate 23, as illustrated in modification 2.

[Modification 4-2]

Figure 19:
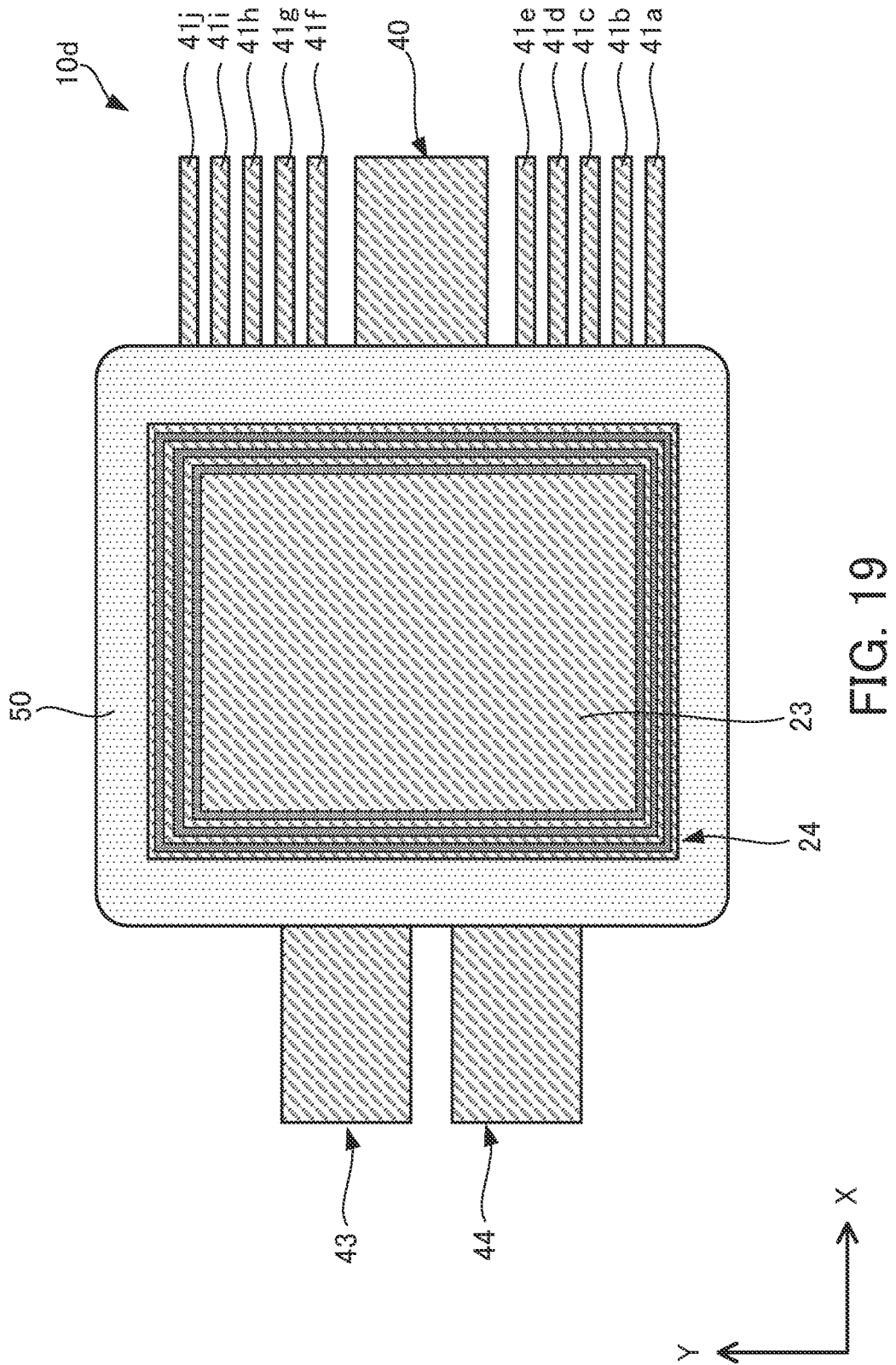
FIG. 19 is a first rear view of a semiconductor device according to modification 4-2 of the first embodiment.
Figure 20:
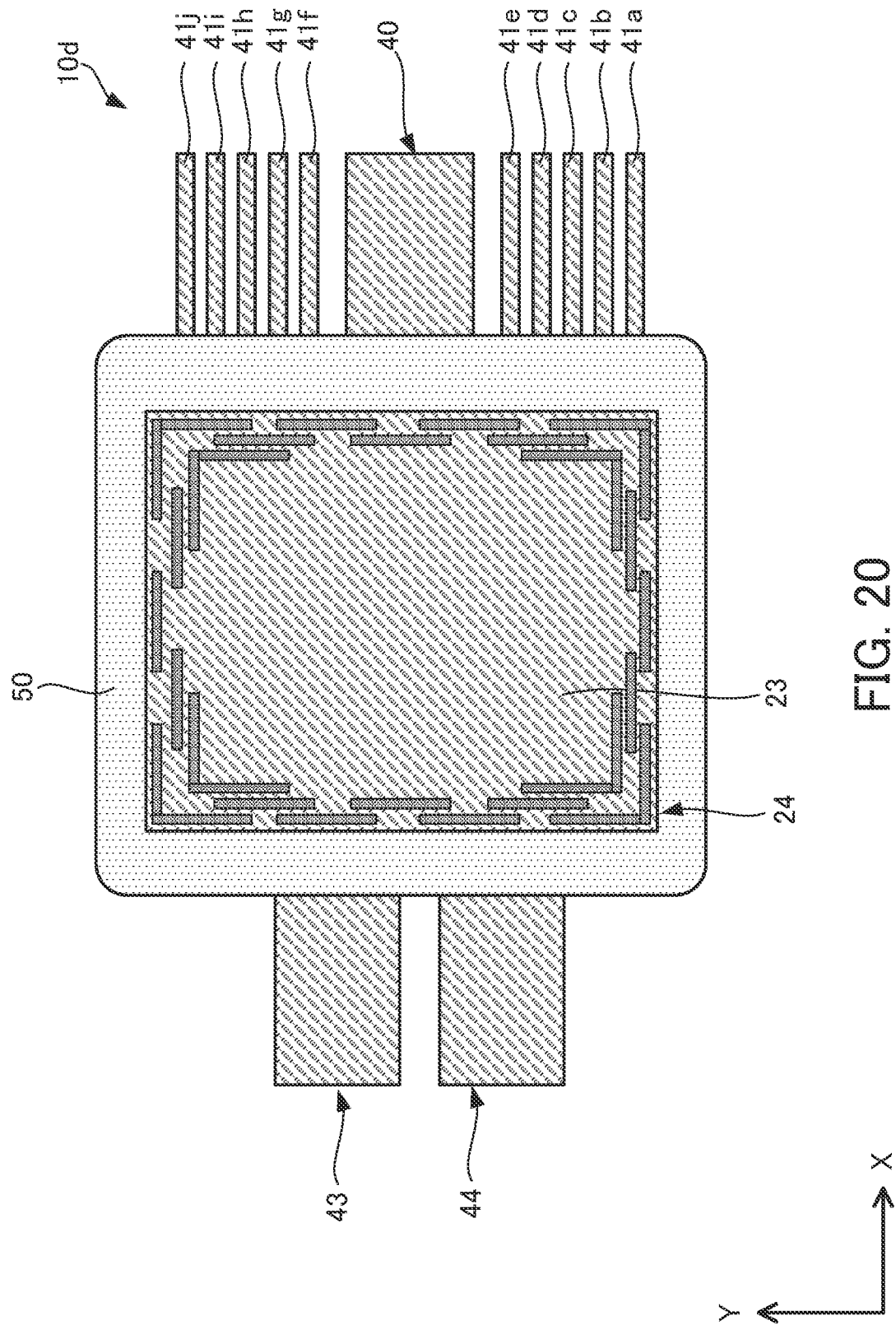
FIG. 20 is a second rear view of the semiconductor device according to modification 4-2 of the first embodiment.

Referring to FIGS. 19 and 20, modification 4-2 is described next, which is directed to the case of providing a plurality of convex portions along the outer edges of the metal plate 23 of the insulated circuit board 20. These convex portions are formed by metal working and have a different shape from the fine projections of modification 4-1. FIGS. 19 and 20 are rear views of a semiconductor device according to modification 4-2 of the first embodiment. In FIGS. 19 and 20, like components to those of the semiconductor device 10 are denoted by like reference numerals.

In the semiconductor device 10d depicted in FIG. 19, the spacer part 24 is convex portions arranged in a circular pattern along the outer edges of the rear surface of the metal plate 23 in such a manner as to encompass the central part of the metal plate 23. The apical end of each convex portion is crushed to be round. Note that FIG. 19 depicts the case where the convex portions are arranged threefold; however, the number of ring-like convex portions is not limited to three, and the spacer part 24 just needs to be made up of at least two ring-like convex portions. The spacer part 24 has such a height as to follow the warpage of the insulated circuit board 20, as in modification 1. That is, when viewed in lateral projection, the spacer part 24 is arranged to be lowest in height at a location corresponding to the central part of the metal plate 23 and becomes higher at a location closer to each of the four corners of the metal plate 23. Also, in the case of the semiconductor device 10d of FIG. 19, before being sealed, each of the ring-like convex portions formed on the outer edges of the metal plate 23 of the insulated circuit board 20 has a spinous apical end in cross section.

Unlike in the case of FIG. 19, the semiconductor device 10d of FIG. 20 has the spacer part 24 whose convex portions are arranged in the form of rings with broken lines along the outer edges of the rear surface of the metal plate 23 in such a manner as to encompass the central part of the metal plate 23. Note that FIG. 20 depicts the case where the convex portions are arranged threefold as an example. As seen in FIG. 20, convex portions in the middle ring are aligned in such a manner as to correspond to gaps between convex portions in the outermost ring, and continuous stretches of convex portions in the innermost ring are placed to correspond to the four corners of the metal plate 23. That is, in FIG. 20, the spacer part 24 is made up of a plurality of convex portions arranged in a staggered layout. Also, in the case of the semiconductor device 10d of FIG. 20, before being sealed, each of the convex portions in a circular pattern formed on the outer edges of the metal plate 23 of the insulated circuit board 20 has a spinous apical end in cross section.

Also, in the case of manufacturing the foregoing semiconductor device 10d of FIGS. 19 and 20, when the insulated circuit board 20 with the lead frames 40, 41a to 41j, and 42 to 44 and the like connected thereto is set in the sealing mold 60, the entire rear surface of the insulated circuit board 20 (the metal plate 23) is lifted off the installation surface 63c by the spacer part 24, as in the case of modification 4-1 (see FIG. 16). Note that the lower mold 62 of the sealing mold 60 according to modification 4-2 is not provided with pressing holes and pins. When the sealing member 50 is injected from the gate 63a, the insulated circuit board 20 and the semiconductor chips 31 and 32 are pressed by the sealing member 50 toward the installation surface 63c. Therefore, the spinous convex portions of the spacer part 24 are crushed under pressure (see FIG. 18). The rear surface of the metal plate 23 of the insulated circuit board 20, lifted off the installation surface 63c is pressed against the installation surface 63c, and thus the region including the central part of the rear surface of the metal plate 23 is brought in contact with the installation surface 63c. The crushed convex portions are densely packed together to close gaps between them.

Further, when injected into the cavity 63b, the sealing member 50 seals the lateral parts of the insulated circuit board 20 and those of the convex portions of the spacer part 24, facing outside, as described above in FIG. 7 of the first embodiment. Thus, the insulated circuit board 20, the semiconductor chips 31 and 32, and the like are sealed together, and then no longer needed frames such as the tie bar 46 are removed, to obtain the semiconductor device 10d.

[Modification 5]

Figure 21:
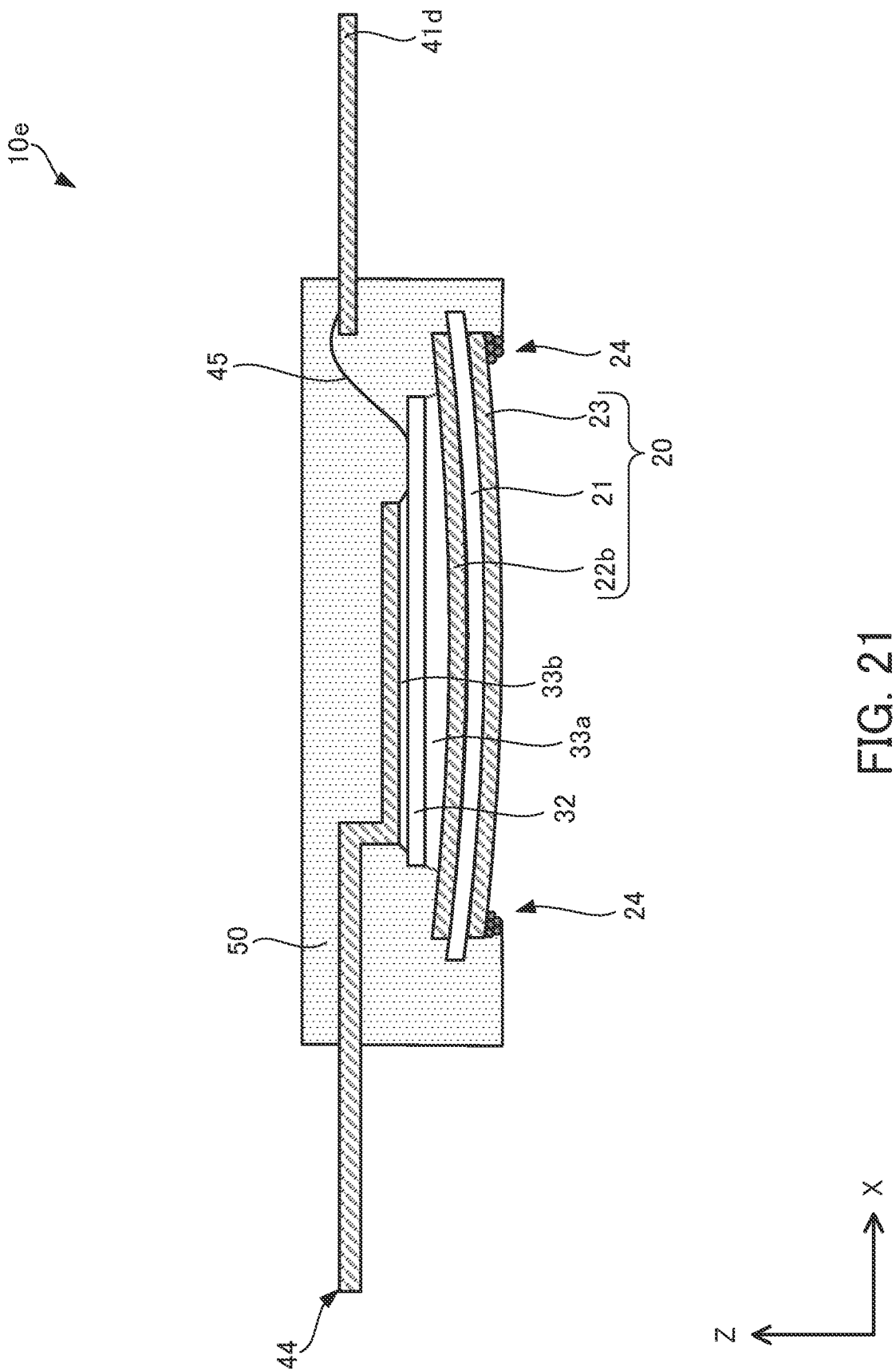
FIG. 21 is a sectional side view of a semiconductor device according to modification 5 of the first embodiment.

Referring to FIG. 21, modification 5 is described next, which is directed to the case of providing a spacer part made up of a particle assemblage, where a plurality of particles clumps together, along the outer edges of the metal plate 23 of the insulated circuit board 20. FIG. 21 is a sectional side view of the semiconductor device according to modification 5 of the first embodiment. Note that FIG. 21 corresponds to the location of the cross section of FIG. 2. In FIG. 21, like components to those of the semiconductor device 10 are denoted by like reference numerals.

In a semiconductor device 10e, the spacer part 24 is formed along the outer edges of the metal plate 23 of the insulated circuit board 20 in such a manner as to encompass the central part of the metal plate 23. The spacer part 24 is made up of a particle assemblage, where a plurality of particles clumps together, provided along the outer edges of the metal plate 23 of the insulated circuit board 20.

In the semiconductor device 10e, the sealing member 50 seals lateral parts of the particle assemblage of the spacer part 24, facing outside (spacer lateral parts), as well as the entire lateral periphery of the insulated circuit board 20. Also, in the semiconductor device 10e, the sealing bottom face 50f lies in the same plane as the apical ends of the spacer part 24 and the central part of the rear surface of the insulated circuit board 20.

Note that modification 5 illustrates the case where the spacer part 24 is made up of a particle assemblage arranged along the outer edges of the metal plate 23 of the insulated circuit board 20; however, this is merely an example and a particle assemblage may be provided as the spacer part 24 at each of the four corners of the metal plate 23 of the insulated circuit board 20, as depicted in FIG. 3. Alternatively, particle assemblages may be individually provided as the spacer part 24 both at and between the four corners of the metal plate 23, as illustrated in modification 2.

The foregoing spacer part 24 provided on the outer edges of the rear surface of the metal plate 23 is formed by spraying particles. The particles used here are metal particles or particles of an elastic material. The metal is, for example, copper, aluminum, or an alloy containing at least one of these. The elastic material is, for example, silicone rubber.

Also, in the case of manufacturing the foregoing semiconductor device 10e of FIG. 21, the spacer part 24 is preliminarily formed by spraying particles in a circular pattern along the outer edges of the rear surface of the metal plate 23 of the insulated circuit board 20. When the insulated circuit board 20 with the spacer part 24 formed thereon and the lead frames 40, 41a to 41j, and 42 to 44 and the like connected thereto is set in the sealing mold 60, the entire rear surface of the insulated circuit board 20 (the metal plate 23) is lifted off the installation surface 63c by the spacer part 24 (see FIG. 16). Note that the lower mold 62 of the sealing mold 60 according to modification 5 is not provided with pressing holes and pins. By heat, the insulated circuit board 20 warps to be convex downward. When the sealing member 50 is injected from the gate 63a, the insulated circuit board 20 and the semiconductor chips 31 and 32 are pressed by the sealing member 50 toward the installation surface 63c. Therefore, the rear surface of the metal plate 23 of the insulated circuit board 20, lifted off the installation surface 63c is pressed against the installation surface 63c, and thus the region including the central part of the rear surface of the metal plate 23 is brought in contact with the installation surface 63c.

Further, when injected into the cavity 63b, the sealing member 50 seals the lateral parts of the insulated circuit board 20 and those of the particles of the spacer part 24, facing outside, as described above in FIG. 7 of the first embodiment. Thus, the insulated circuit board 20, the semiconductor chips 31 and 32, and the like are sealed together, and then no longer needed frames such as the tie bar 46 are removed, to obtain the semiconductor device 10e.

(b) Second Embodiment

Figure 22:
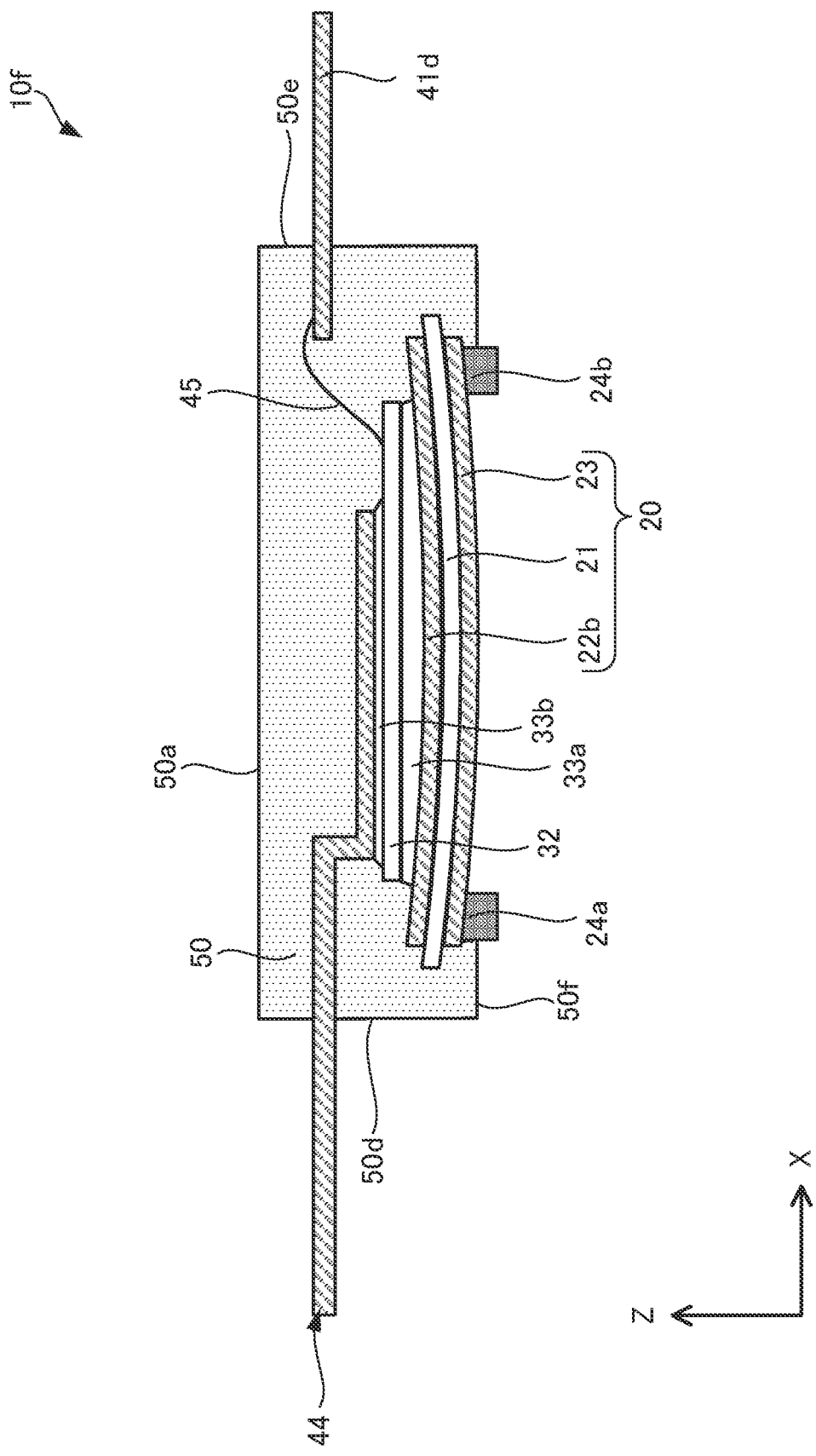
FIG. 22 is a sectional side view of a semiconductor device of a second embodiment.

Next described is a semiconductor device according to a second embodiment, with reference to FIG. 22. FIG. 22 is a sectional side view of the semiconductor device of the second embodiment. Note that the sectional side view of FIG. 22 corresponds to FIG. 2. As for the semiconductor device of the second embodiment, like components to those of the semiconductor device 10 of the first embodiment are denoted by like reference numerals.

A semiconductor device 10f differs from the semiconductor device 10 in that the spacer parts 24a to 24d protrude further downward (in the −Z direction) than the sealing bottom face 50f and the central part of the metal plate 23. The spacer parts 24a to 24d are made of the same material as that of the spacer parts 24a to 24d of the semiconductor device 10. Note however that the spacer parts 24a to 24d are longer in shape than the spacer parts 24a to 24d of the semiconductor device 10. Otherwise, the semiconductor device 10f has the same configuration as the semiconductor device 10.

Figure 23:
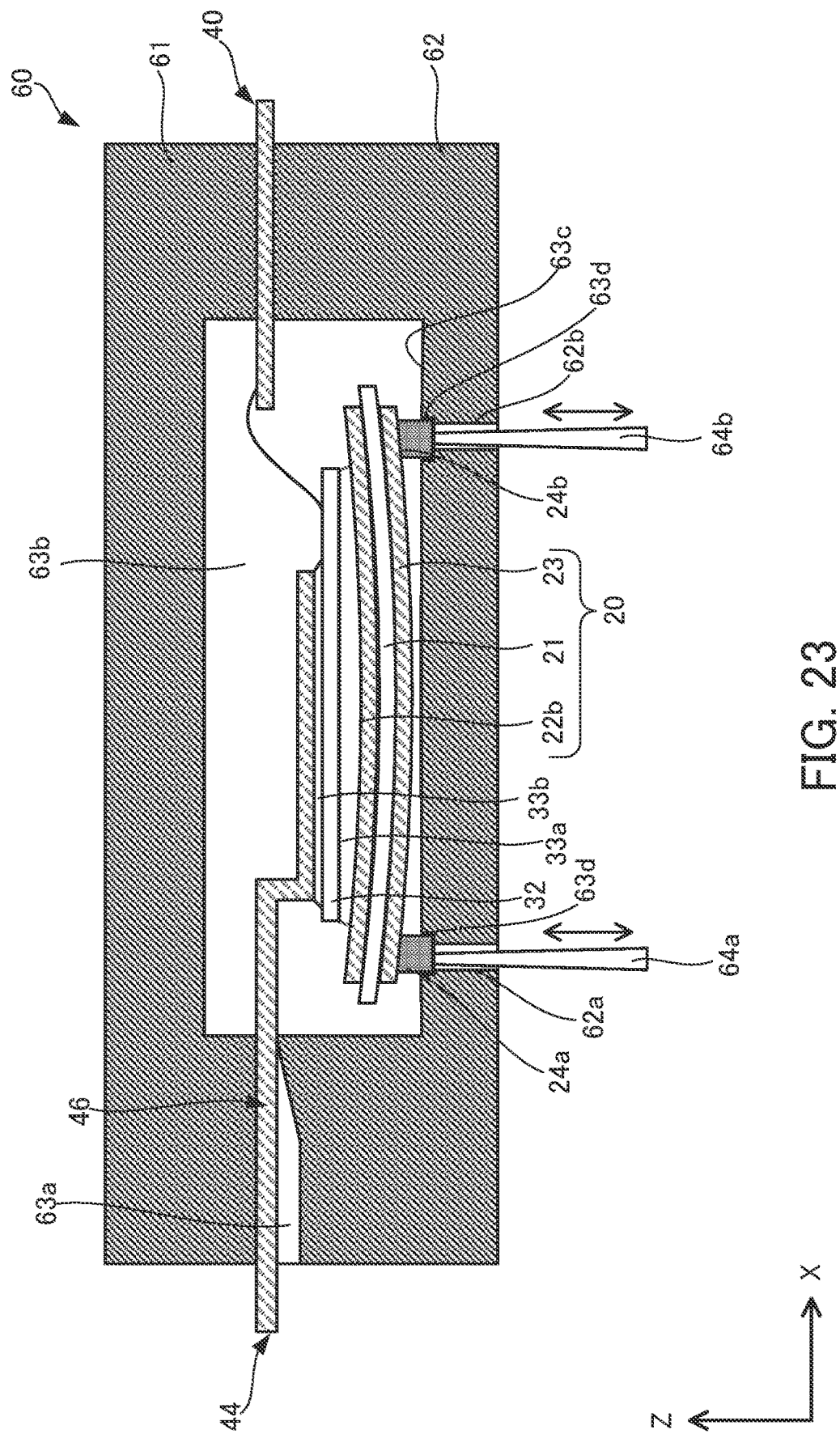
FIG. 23 is a sectional side view illustrating a manufacturing process of the semiconductor device according the second embodiment.

Next described is a method of manufacturing the foregoing semiconductor device 10f, with reference to FIG. 23. FIG. 23 is a sectional side view illustrating the manufacturing process of the semiconductor device according to the second embodiment. The lead frame 42 is connected to the semiconductor chips 31 and 32 bonded to the insulated circuit board 20 and the lead frames 40, 43, and 44 coupled to the tie bar 46 are connected to the insulated circuit board 20, as in the first embodiment depicted in FIG. 4. Then, the lead frames 41a to 41j coupled to the tie bar 46 and the semiconductor chips 31 and 32 are mechanically and electrically connected by the bonding wires 45.

Next, the insulated circuit board 20 with the lead frames 40, 41a to 41j, and 42 to 44 and the like thus connected thereto is placed in the sealing mold 60 via the spacer parts 24a to 24d. The sealing mold 60 has the same configuration as in the first embodiment. Note however that concave pits 63d are formed on the installation surface 63c of the lower mold 62, at locations corresponding to the spacer parts 24a to 24d. That is, the pressing holes 62a and 62b are provided at the bottom of the individual concave pits 63d. The opening area of each of the concave pits 63d corresponds to the area of the corresponding one of the spacer parts 24a to 24d in a plan view. The depth of the concave pits 63d is that for the spacer parts 24a to 24d to recede when the central part of the metal plate 23 of the insulated circuit board 20 is brought in contact with the installation surface 63c. Note that the pressing pins 64a and 64b are set in the pressing holes 62a and 62b. The tips of the pressing pins 64a and 64b are positioned at or lower (in the −Z direction) than the bottom of the concave pits 63d.

When the insulated circuit board 20 with the lead frames 40, 41a to 41j, and 42 to 44 and the like connected thereto is placed on the installation surface 63c of the lower mold 62, the spacer parts 24a to 24d are provided at the four corners of the metal plate 23. That is, as illustrated in FIG. 23, the spacer parts 24a to 24d mate with the concave pits 63d of the installation surface 63c. At that time, due to the spacer parts 24a to 24d, the insulated circuit board 20 except for the four corners of the metal plate 23 is lifted a little off the installation surface 63c. In this case, the gap between the central part of the metal plate 23 and the installation surface 63c is, for example, in the range of 10 μm to 200 μm.

From this condition, the manufacturing process of the semiconductor device 10f follows that in the first embodiment. That is, the sealing member 50 is injected into the cavity 63b from the gate 63a, as in the first embodiment. The injected sealing member 50 seals the lateral parts of the insulated circuit board 20 as pressing the insulated circuit board 20 toward the installation surface 63c. The sealing member 50 further seals lateral parts of the spacer parts 24a to 24d, protruding from the concave pits 63d and facing outside (spacer lateral parts). After sealing, the pressing pins 64a and 64b are thrust upward, to thereby detach the insulated circuit board 20 and the like encapsulated with the sealing member 50 from the lower mold 62. Thus, the insulated circuit board 20, the semiconductor chips 31 and 32, and the like are sealed together, and then no longer needed frames such as the tie bar 46 are removed, to obtain the semiconductor device 10f depicted in FIG. 22.

Figure 24:
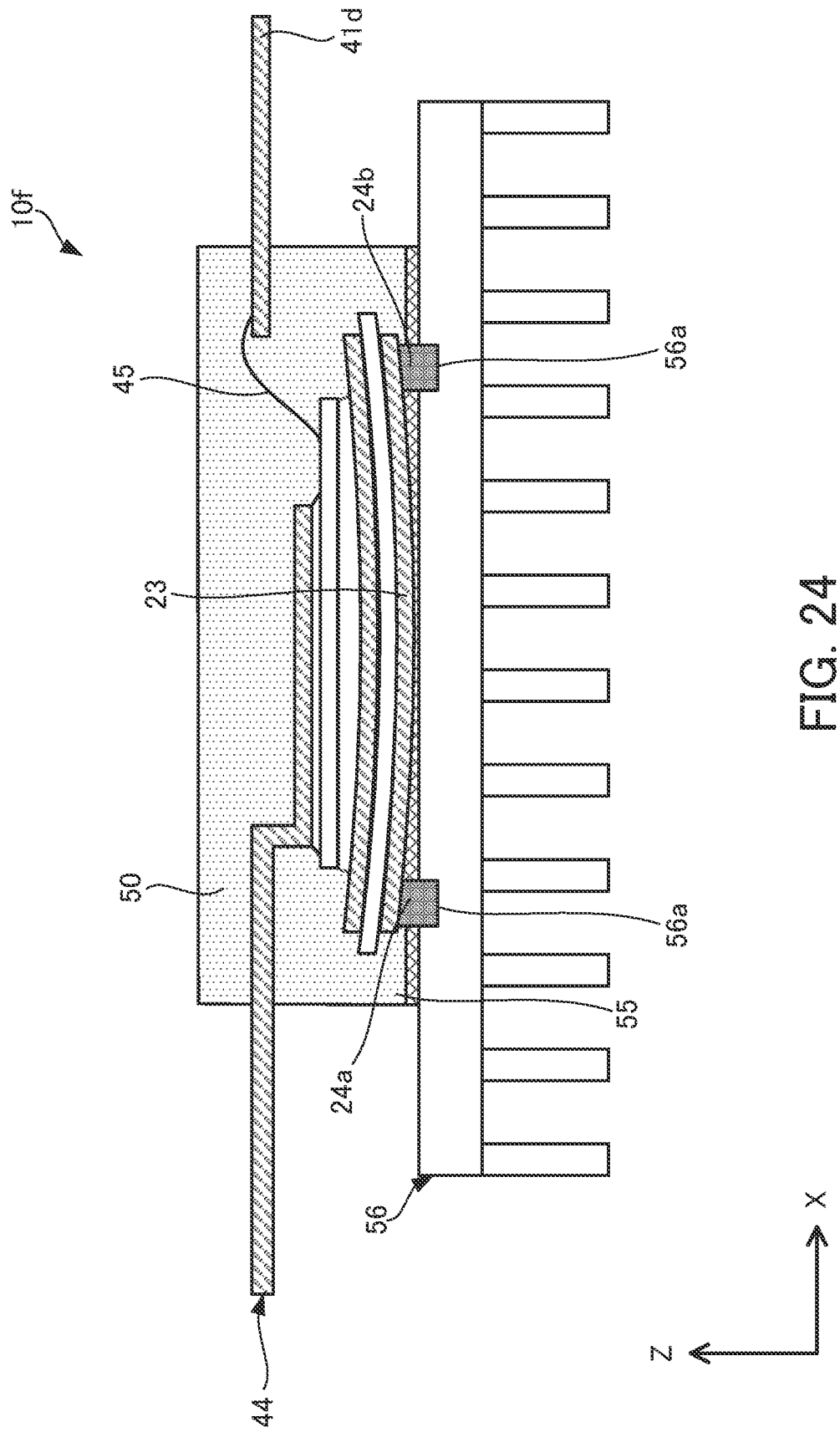
FIG. 24 is a sectional side view of the semiconductor device with a heatsink unit mounted thereon, according to the second embodiment.

Next described is the case of mounting the heatsink unit 56 on the rear surface (the sealing bottom face 50f) of the foregoing semiconductor device 10f, with reference to FIG. 24. FIG. 24 is a sectional side view of the semiconductor device with the heatsink unit mounted thereon, according to the second embodiment. Note that FIG. 24 depicts the case where the heatsink unit is mounted on the semiconductor device 10f corresponding to the sectional side view of FIG. 22.

The heatsink unit 56 is provided on the rear surface of the semiconductor device 10f via the TIM 55. The heatsink unit 56 has the same configuration as the heatsink unit 56 of the first embodiment. Note however that the heatsink unit 56 according to the second embodiment has aligning parts 56a at locations corresponding to the spacer parts 24a to 24d of the semiconductor device 10f. Each of the aligning parts 56a is a concave pit having a size allowing the corresponding one of the spacer parts 24a to 24d to mate with.

The TIM 55 is applied to the rear surface of the foregoing semiconductor device 10f. Alternatively, the TIM 55 may be applied, within the heatsink unit 56, to the region where the semiconductor device 10f is installed, except for the aligning parts 56a. At that time, the spacer parts 24a to 24d protrude out of the TIM 55. In mounting the semiconductor device 10f on the heatsink unit 56, the spacer parts 24a to 24d mate with the aligning parts 56a. This ensures reliable installation of the semiconductor device 10f on the heatsink unit 56. In addition, the semiconductor device 10f installed in this manner is less likely to be dislocated from the heatsink unit 56. Hence, it is possible to properly and reliably mount the heatsink unit 56 on the rear surface of the semiconductor device 10f.

[Modification]

Figure 25:
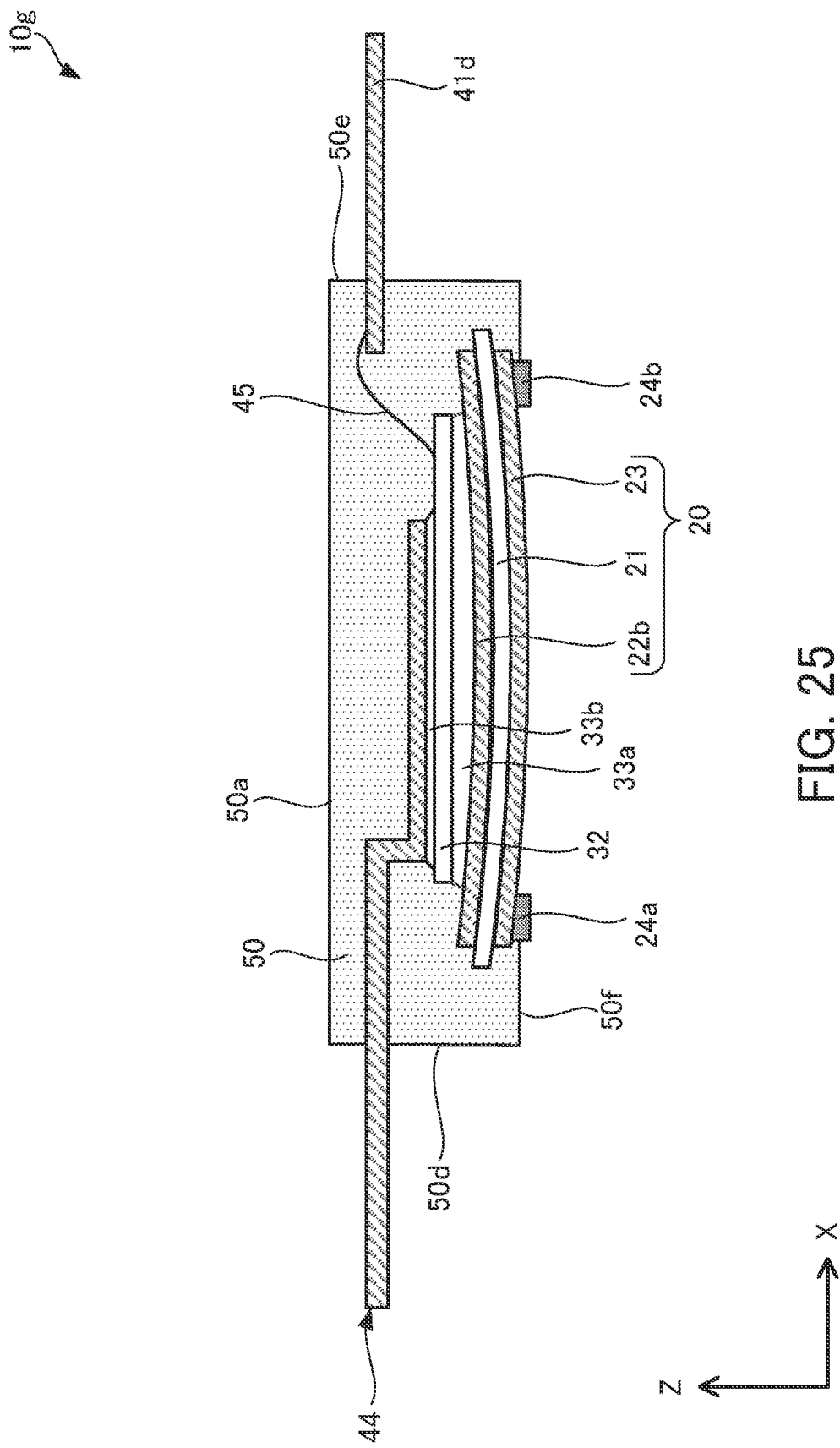
FIG. 25 is a sectional side view of a semiconductor device according to a modification of the second embodiment.

A modification next is directed to the case of using a sealing mold different from that of the second embodiment. First, a semiconductor device of the modification is described with reference to FIG. 25. FIG. 25 is a sectional side view of the semiconductor device according to the modification of the second embodiment. Note that the sectional side view of FIG. 25 corresponds to FIG. 2. As for the semiconductor device of the modification, like components to those of the semiconductor device 10 of the first embodiment are denoted by like reference numerals.

A semiconductor device 10g differs from the semiconductor device 10 in that the sealing bottom face 50f is located above the level of the bottom faces of the spacer parts 24a to 24d and the central part of the metal plate 23 warping to be convex downward. Otherwise, the semiconductor device 10g has the same configuration as the semiconductor device 10.

Figure 26:
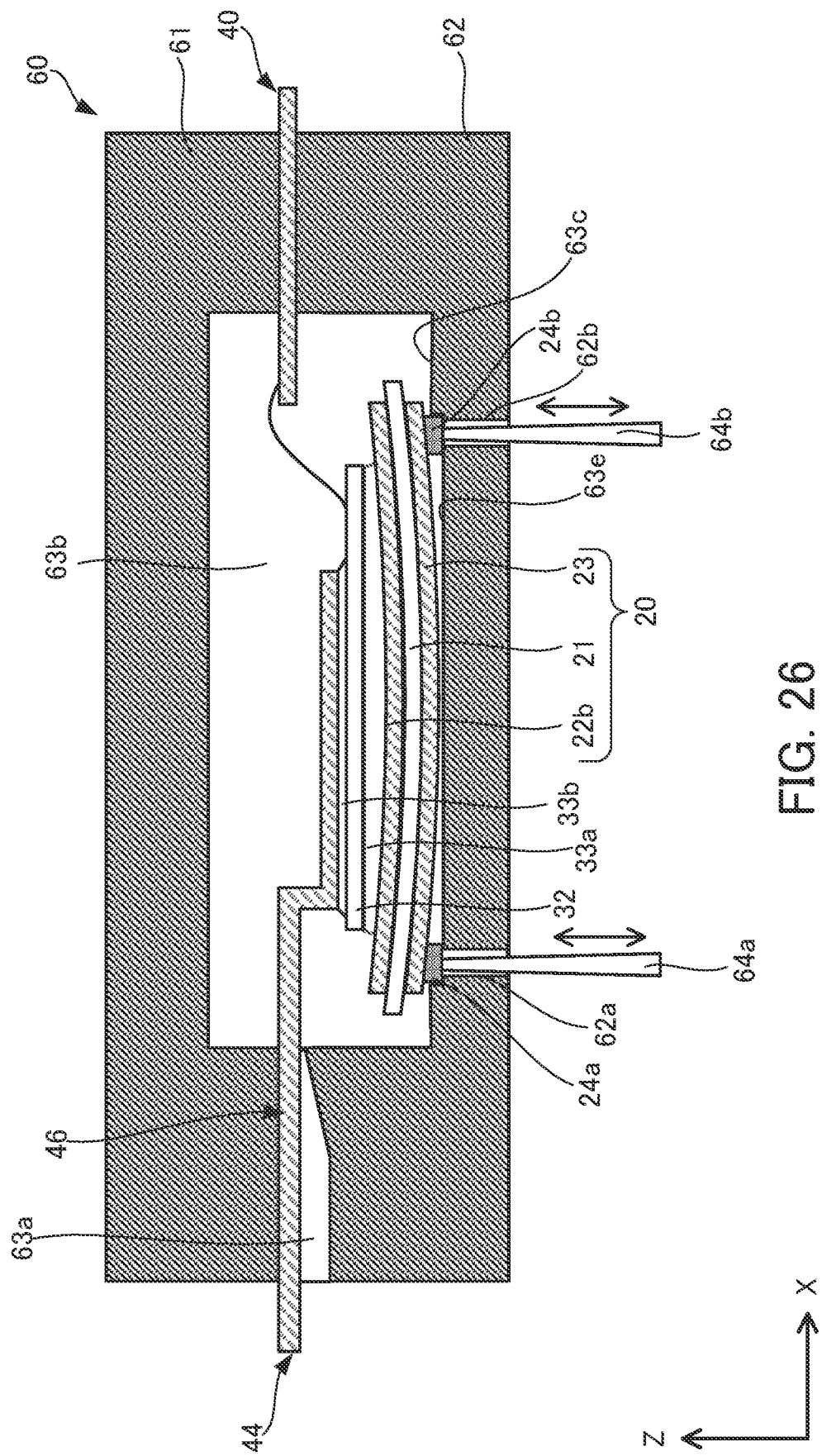
FIG. 26 is a sectional side view illustrating a manufacturing process of the semiconductor device according to the modification of the second embodiment.

Next described is a method of manufacturing the semiconductor device 10g described above, with reference to FIG. 26. FIG. 26 is a sectional side view illustrating the manufacturing process of the semiconductor device according to the modification of the second embodiment. The lead frame 42 is connected to the semiconductor chips 31 and 32 bonded to the insulated circuit board 20 and the lead frames 40, 43, and 44 coupled to the tie bar 46 are connected to the insulated circuit board 20, as in the first embodiment depicted in FIG. 4. Then, the lead frames 41a to 41j coupled to the tie bar 46 and the semiconductor chips 31 and 32 are mechanically and electrically connected by the bonding wires 45.

Next, the insulated circuit board 20 with the lead frames 40, 41a to 41j, and 42 to 44 and the like thus connected thereto is placed in the sealing mold 60 via the spacer parts 24a to 24d. The sealing mold 60 has the same configuration as in the first embodiment. Note however that a concave pit 63e is formed, over the installation surface 63c of the lower mold 62, in the region where the insulated circuit board 20 is positioned. The concave pit 63e is cubical in shape. At the four corners of the concave pit 63e in a planer view, pressing holes for insertion of the pressing pins (FIG. 26 depicts the pressing holes 62a and 62b into which the pressing pins 64a and 64b are inserted) are provided.

When the insulated circuit board 20 with the lead frames 40, 41a to 41j, and 42 to 44 and the like connected thereto is placed on the installation surface 63c of the lower mold 62, the spacer parts 24a to 24d are provided at the four corners of the metal plate 23. That is, as illustrated in FIG. 26, the spacer parts 24a to 24d are individually located at the four corners of the concave pit 63e of the installation surface 63c. At that time, due to the presence of the spacer parts 24a to 24d, the insulated circuit board 20 except for the four corners of the metal plate 23 is lifted a little off the bottom face of the concave pit 63e. In this case, the gap between the central part of the metal plate 23 and the installation surface 63c is, for example, in the range of 10 µm to 200 µm.

From this condition, the sealing member 50 is injected into the cavity 63b from the gate 63a, as in the first embodiment. The injected sealing member 50 seals the lateral parts of the insulated circuit board 20 as pressing the insulated circuit board 20 toward the installation surface 63c. The sealing member 50 further seals lateral parts of the spacer parts 24a to 24d, protruding from the concave pit 63e and facing outside (spacer lateral parts). Thus, the insulated circuit board 20, the semiconductor chips 31 and 32, and the like are sealed together, and then no longer needed frames such as the tie bar 46 are removed, to obtain the semiconductor device 10g depicted in FIG. 25.

Also, in mounting the foregoing semiconductor device 10g on the heatsink unit 56, the spacer parts 24a to 24d mate with the aligning parts 56a via the TIM 55, as in FIG. 24. This ensures reliable installation of the semiconductor device 10g on the heatsink unit 56. In addition, the semiconductor device 10g installed in this manner is less likely to be dislocated from the heatsink unit 56. Hence, it is possible to properly and reliably mount the heatsink unit 56 on the rear surface of the semiconductor device 10g.

Note that the second embodiment is not limited to the case of using the spacer parts 24a to 24d provided at the four corners of the metal plate 23. The spacer parts of modifications 1 to 5 of the first embodiment may be used instead. In this case, the concave pit or pits formed in the lower mold 62 of the sealing mold 60 may be made in a shape that depends on the shape of the spacer parts used.

According to one aspect, it is possible to prevent formation of burrs, which in turn reduces the degradation of heat dissipation, thus securing the reliability of the semiconductor device.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device, comprising:
   a semiconductor chip;
   an insulated circuit board including:
      a metal plate having a rectangular shape, the metal plate having a front surface and a rear surface opposite to each other, the rear surface of the metal plate serving as a rear surface of the insulated circuit board, an insulating plate having a rectangular shape and being disposed on the front surface of the metal plate, and a circuit pattern having a front surface and a rear surface opposite to each other, and being disposed on the insulating plate, the semiconductor chip being disposed on the front surface of the circuit pattern, the front surface of the circuit pattern serving as a front surface of the insulated circuit board, the insulated circuit board being warped to be convex in a thickness direction of the insulated circuit board away from the front surface of the insulated circuit board; and a spacer part disposed on a periphery of the rear surface of the metal plate including at least one of four corners of the metal plate in a plan view of the semiconductor device, and protruding in the thickness direction away from the front surface of the insulated circuit board.

2. The semiconductor device according to claim 1, wherein a bottom of the spacer part is positioned at a same plane as a position of a center of the insulated circuit board that is warped in the thickness direction away from the front surface of the insulated circuit board, or is positioned, in the thickness direction away from the front surface of the insulated circuit board, farther from the position of the center of the insulated circuit board.

3. The semiconductor device according to claim 1, wherein the spacer part is disposed at each of the four corners of the metal plate on the periphery of the rear surface of the metal plate.

4. The semiconductor device according to claim 3, further comprising, in addition to the spacer part disposed at each of the four corners of the metal plate, one or more additional spacer parts provided between any adjacent two corners along the periphery of the metal plate.

5. The semiconductor device according to claim 1, wherein the spacer part is disposed along the periphery of the rear surface of the metal plate including the four corners so as to surround a center of the insulated circuit board.

6. The semiconductor device according to claim 5, wherein a height in the thickness direction of the spacer part between two adjacent corners of the metal plate increases as a position approaches one of the two corners.

7. The semiconductor device according to claim 1, wherein the spacer part is disposed along the entire periphery of the rear surface of the metal plate.

8. The semiconductor device according to claim 1, further comprising:
a sealing member sealing the front surface of the insulated circuit board, side faces of the insulated circuit board, and an outer side face of the spacer part.

9. The semiconductor device according to claim 8, wherein a bottom of the sealing member and a center of the insulated circuit board are formed in a same plane.

10. The semiconductor device according to claim 9, wherein the bottom of the spacer part is positioned, in the thickness direction, further away from the front surface of the insulated circuit board than is a position of the bottom of the sealing member.

11. The semiconductor device according to claim 1, wherein the spacer part is integrally provided with the metal plate.

12. The semiconductor device according to claim 1, wherein the spacer part includes a plurality of fine projections.

13. The semiconductor device according to claim 1, wherein the spacer part includes a plurality of line parts each having a ring shape in the plan view, each line part being provided along the periphery of the metal plate so as to surround a center of the metal plate.

14. The semiconductor device according to claim 1, wherein:
the spacer part includes a plurality of line parts, each line part including a plurality of line patterns that form a broken line pattern along the periphery of the metal plate, whereby the spacer part includes a plurality of broken line patterns along the periphery of the metal plate, each broken line pattern surrounding a center of the metal plate.

15. The semiconductor device according to claim 1, wherein the spacer part includes a plurality of particles that are clumped together.

16. The semiconductor device according to claim 1, further comprising:
a thermal interface material; and
a heatsink unit disposed via the thermal interface material on the rear surface of the insulated circuit board.

17. The semiconductor device according to claim 1, further comprising:
a thermal interface material; and
a heatsink unit having an aligning part that includes a recess that is engaged with the spacer part, the heatsink unit being disposed via the thermal interface material on the rear surface of the insulated circuit board.

\* \* \* \* \*